United States Patent
Wang et al.

(10) Patent No.: US 10,312,946 B2
(45) Date of Patent: Jun. 4, 2019

(54) SOFT-OUTPUT DECODING OF CODEWORDS ENCODED WITH POLAR CODE

(71) Applicant: Mitsubishi Electric Research Laboratories, Inc., Cambridge, MA (US)

(72) Inventors: Ye Wang, Andover, MA (US); Toshiaki Koike-Akino, Belmont, MA (US); Stark C Draper, Toronto (CA)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/467,321

(22) Filed: Mar. 23, 2017

(65) Prior Publication Data

US 2018/0226999 A1    Aug. 9, 2018

Related U.S. Application Data

(60) Provisional application No. 62/455,172, filed on Feb. 6, 2017.

(51) Int. Cl.
*H03M 13/00* (2006.01)
*H03M 13/39* (2006.01)
(Continued)

(52) U.S. Cl.
CPC ....... *H03M 13/3961* (2013.01); *H03M 13/13* (2013.01); *H03M 13/251* (2013.01);
(Continued)

(58) Field of Classification Search
CPC ......... H03M 13/3961; H03M 13/3784; H03M 13/3753; H04L 1/0041; H04L 1/0045; H04L 1/0057
See application file for complete search history.

(56) References Cited

U.S. PATENT DOCUMENTS 8,347,186 B1    1/2013  Arikan
2015/0256196 A1*  9/2015  Alhussien .......... G06F 11/1076
                                                    714/807
(Continued)

OTHER PUBLICATIONS

Dong-Min Shin et al. "Mapping Selection and Code Construction for 2m-ary Polar-Coded Modulation," Oct. 6, 2011, revised Jan. 9, 2012. CSDL Technical Report, No. CSDL-2011-08.
(Continued)

*Primary Examiner* — Samir W Rizk
(74) *Attorney, Agent, or Firm* — Gennadiy Vinokur; James McAleenan; Hironori Tsukamoto

(57) ABSTRACT

A receiver includes a polar decoder for decoding an encoded codeword transmitted over a communication channel. The receiver includes a front end to receive over a communication channel a codeword including a sequence of bits modified with noise of the communication channel and a soft decoder operated by a processor to produce a soft output of the decoding. The codeword is encoded by at least one polar encoder with a polar code. The processor is configured to estimate possible values of the bits of the received codeword using a successive cancelation list (SCL) decoding to produce a set of candidate codewords, determine a distance between each candidate codeword and a soft input to the soft decoder, and determine a likelihood of a value of a bit in the sequence of bits using a difference of distances of the candidate codewords closest to the received codeword and having opposite values at the position of the bit.

20 Claims, 23 Drawing Sheets

(51) Int. Cl.
| | |
|---|---|
| H03M 13/37 | (2006.01) |
| H04L 1/00 | (2006.01) |
| H03M 13/27 | (2006.01) |
| H03M 13/29 | (2006.01) |
| H03M 13/13 | (2006.01) |
| H03M 13/25 | (2006.01) |
| H03M 13/35 | (2006.01) |
| H03M 13/45 | (2006.01) |
| H03M 13/09 | (2006.01) |

(52) U.S. Cl.
CPC ....... *H03M 13/27* (2013.01); *H03M 13/2792* (2013.01); *H03M 13/2906* (2013.01); *H03M 13/2909* (2013.01); *H03M 13/2927* (2013.01); *H03M 13/2963* (2013.01); *H03M 13/353* (2013.01); *H03M 13/356* (2013.01); *H03M 13/3753* (2013.01); *H03M 13/3784* (2013.01); *H03M 13/458* (2013.01); *H03M 13/6502* (2013.01); *H03M 13/658* (2013.01); *H03M 13/6577* (2013.01); *H03M 13/6594* (2013.01); *H04L 1/0041* (2013.01); *H04L 1/0045* (2013.01); *H04L 1/0057* (2013.01); *H04L 1/0058* (2013.01); *H04L 1/0064* (2013.01); *H04L 1/0071* (2013.01); *H03M 13/09* (2013.01); *H03M 13/2739* (2013.01); *H03M 13/2918* (2013.01)

(56) References Cited

U.S. PATENT DOCUMENTS

| | | | |
|---|---|---|---|
| 2018/0019766 A1* | 1/2018 | Yang | H03M 13/13 |
| 2018/0083655 A1* | 3/2018 | El-Khamy | G06F 17/5081 |

OTHER PUBLICATIONS

Guo et al. "Enhanced Belief Propagation Decoding of Polar Codes through Concatenation," Information Theory (ISIT), 2014 IEEE International Symposium on. Date of Conference: Jun. 29-Jul. 4, 2014, Date Added to IEEE Xplore: Aug. 11, 2014.

Erdal Arikan, "Channel polarization: A method for constructing capacity-achieving codes for symmetric binary-input memoryless channels," IEEE Transactions on Information Theory ( vol. 55, Issue: 7, Jul. 2009 ) pp. 3051-3073.

Ido Tal et al. "How to Construct Polar Codes," eprint arXiv:1105.6164, May 2011, ARXIV, Computer Science—Information Theory, Bibliographic Code: 2011arXiv1105.6164T.

Ido Tal et al. "List Decoding of Polar Codes," eprint arXiv:1206.0050, May 2012, ARXIV, Computer Science—Information Theory, Bibliographic Code: 2012arXiv1206.0050T.

Seidl, Mathis et al. "Aspects of Polar-Coded Modulation," eprint arXiv:1211.6918, Nov. 2012. ARXIV, Computer Science Information Theory, Accepted for presentation at International ITG Conference on Systems, Communications and Coding, Munich, Germany, Jan. 2013. Bibliographic Code: 2012arXiv1211.6918S.

Mahdavifar et al. "Polar Coding for Bit-Interleaved Coded Modulation," IEEE Transactions on Vehicular Technology ( vol. 65, Issue: 5, May 2016) pp. 3115-3127. Jun. 10, 2015.

Ubaid U. Fayyaz and John R. Barry, "Low-Complexity Soft-Output Decoding of Polar Codes," IEEE Journal on Selected Areas in Communications, vol. 32, No. 5, May 2014. pp. 958-966.

Norbert Stolte, "Recursive Codes with the Plotkin-Construction and Their Decoding." English translation of Ph. D. thesis which was approved by the faculty of Electronics and Information Technology of the University of Technology Darmstadt, Germany. Submission: Oct. 28, 2001, Defence: Jan. 9, 2002. http://www.nesi.e-technik.tu-darmstadt.de/stolte.

Tal Ido et al., "List Decoding of Polar Codes," IEEE Transactions on Information Theory, IEEE Press, USA. vol. 61, No. 5, May 1, 2015. pp. 2213-2226.

Jun Lin et al., "A Reduced Latency List Decoding Algorithm for Polar Codes," IEEE Workshop on Signal Processing Systems, Oct. 1, 2014. pp. 1-6.

Fossorier MPC et al., "Soft input Soft output List Based Decoding Algorithm," IEEE Transactions on Communications, vol. 52, No. 2, Feb. 1, 2004. pp. 252-262.

RM Pyndiah, "Near Optimum Decoding of Product Codes: Block Turbo Codes," IEEE Transactions on Communications, Jan. 1, 1998, pp. 1003-1010.

Frederic Gabry et al., :Multi Kernel Construction of Polar Codes, Arxiv.Org. Cornell University Library, 201 Olin Library, Ithaca, NY. Dec. 19, 2016.

Erdal Arikan: "Polar Codes: A Pipelined Implementation," Proc., 4th International Symposium on Broadband Communication, ISBC 2010, Jul. 11-14, 2010, Melaka, Malaysia, Jul. 14, 2010. pp. 1-4.

El Khamy Mostafa et al., "Relaxed Channel Polarization for Reduced Complexity Polar Coding," Proc. IEEE Wireless Communications and Networking Conference, 2015. Mar. 9, 2015. pp. 207-212.

El Khamy Mostafa et al., "Relaxed Polar Codes," IEEE Transactions on Information Theory, Jul. 16, 2015. pp. 1986-2000.

Wu Dongsheng et al., Parallel Concatenated Systematic Polar Codes, Electornics Letters, IEEE Stevenage, GB. vol. 52, No. 1, Jan. 8, 2016. pp. 43-45.

Mukhtar et al., "Turbo Product Codes, Applications Challenges and Future Directions," IEEE Communications Surveys & Tutorials, vol. 18, No. 4, Jul. 7, 2016. pp. 3052-3069.

Hu Guanghui et al., "Beyond 100Gbps Encpder Design for Staircase Codes," Proc., IEEE International Workshop on Signal Processing Systems, Oct. 26, 2016. pp. 154-158.

Shi Zhengming et al., "On Optimized Uniform Quantization for SC Decoder of Polar Codes," Proc., IEEE 80th Vehicular Technology Conference (VTC2014-Fall), IEEE, Sep. 14, 2014. pp. 1-5.

Hashemi Seyyed Ali et al., "Partitioned Successive Cancellation List Decoding of Polar Codes," Proc., IEEE International Conference on Acoustics, Speech and Signal Processing, Mar. 20, 2016. pp. 957-960.

Zhou Huayi et al., "Segmented CRC Aided SC List Polar Decoding," Proc., IEEE 83rd Vehicular Technology Conference, VTC Spring, May 15, 2016. pp. 1-5.

* cited by examiner

SOFT-OUTPUT DECODING OF CODEWORDS ENCODED WITH POLAR CODE

FIELD OF THE INVENTION

This invention relates to communications systems and method, and more specifically to digital communications using polar codes for forward error correction (FEC) coding.

BACKGROUND

In the field of digital communications, forward error correction (FEC) through the application of an error correcting code (ECC) is the technique of encoding messages to add redundancy in order to mitigate the uncertainty introduced by a noisy communication channel, allowing transmission errors to be reduced by a decoder. Generally, an ECC is a technique for converting a sequence of data symbols (representing a message) into a more redundant sequence of code symbols that are transmitted over a noisy channel. A decoder is a system or a method for recovering an estimate of the data symbols from the noisy output of the channel.

A particular family of ECCs called polar codes was introduced by Arikan in 2009, which provides an explicit code construction technique for binary input channels along with a decoder that provably converges toward optimal coding efficiency (i.e., achieving the channel capacity) in the asymptotic of coding over larger blocks of data. The polar codes, as proposed by Arikan, encode a message, represented as a sequence of k data binary symbols ("bits"), into a sequence of n code bits, where n is a power of two in general and larger than k. Specifically, the encoding procedure first writes the k data bits into the vector $u:=(u_0, \ldots, u_{n-1})$ at the k locations specified by a data index set $I \subset \{0, \ldots, n-1\}$ with cardinality $|I|=k$, while the remaining n−k locations are set to arbitrary, but known, fixed values.

Then, the n coded bits, denoted by the vector $c:=(c_0, \ldots, c_{n-1})$, are determined by the formula $c=uBF^{\otimes m}$, where the matrix multiplications are carried out over the binary field (i.e., modulo-2 arithmetic), B denotes the n×n bit-reversal permutation matrix, and $F^{\otimes m}$ in is the m-th Kronecker power of the matrix $$F := \begin{bmatrix} 1 & 0 \\ 1 & 1 \end{bmatrix},$$

and $m:=\log_2 n$ is the polarization stage. A polar code is fully specified by the data index set I and the parameters n and k. Thus, the key to constructing a polar code is choosing a data index set I (equivalently, its complementary set, frozen bit location) suitable for the noisy channel.

The successive cancellation (SC) decoder provided by Arikan helps explaining the specifics of the polar code construction technique. The SC decoder takes as input the noisy output of the channel denoted by $y:=(y_0, \ldots, y_{n-1})$, where each $y_i$ is a noisy observation of the corresponding code bit $c_i$. The SC decoder proceeds sequentially over the bits, from index 0 to n−1, where for each index $i \in \{0, \ldots, (n-1)\}$, an estimate $\hat{u}_i$ for bit $u_i$ is made as follows: if $i \notin I$ (i.e., frozen bit location), then $\hat{u}_i$ is set to the known, fixed value of $u_i$, otherwise, when $i \in I$, $\hat{u}_i$ is set to the most likely value for $u_i$ given the channel outputs y and assuming that the previous estimates $(\hat{u}_0, \ldots, \hat{u}_{i-1})$ are correct. Sampling these estimates at the indices $i \in I$ gives the estimate for the data bits. Each estimate $\hat{u}_i$ is made with respect to the conditional distribution $P(y, u_0, \ldots, u_{i-1} | u_i)$, which follows from the polar code structure and underlying channel statistics, and can also be thought to represent a pseudo-channel for the bit $u_i$. With the aim of maximizing the accuracy of the estimates $\hat{u}_i$, the data index set I should be chosen to select the k most reliable pseudo-channels.

Polar codes can also be systematically encoded, which is a key property to enable their application in certain concatenated codes. The systematic encoding procedure for polar codes produces a valid codeword such that the data bits appear directly in the codeword at the locations specified by the index J, which denotes the bit-reversal permutation of the locations in I. The system encoding procedure writes the k data bits into a vector u at the locations in J, while the other locations are set to zero, and then applies the polar encoding procedure twice, while setting the frozen bit locations (i.e., the locations not in I) to zero on the intermediate result between the encodings. This procedure is equivalent to applying the formula $c=\phi_I(uBF^{\otimes m})BF^{\otimes m}$, where $\phi_I(\cdot)$ denotes setting the bits at the locations not in I equal to zero. The codeword c that results from this procedure contains the data bits written at the locations in J, while the remaining locations not in J contain bits called the parity bits. In some situations, it may be convenient to rearrange the codeword c by a permutation that places the k data bit locations (specified by the index set J) first, followed by the n−k parity locations (specified by the complement of the index set J). With such a permutation, the encoding procedure results in the vector of k data bits appended with the n−k parity bits computed by the systematic polar encoding procedure.

While the SC decoder achieves capacity in the asymptotic of large code length n, as proven by Arikan, its practical error correction performance for shorter code lengths n can be improved. A list-decoding improvement of the SC decoder (SCL) was proposed by Tal and Vardy in 2015. The SCL decoder proceeds similarly to the SC decoder, except that for each data bit index $i \in I$, the decoder branches to consider both possible estimates, $\hat{u}_i=0$ and $\hat{u}_i=1$, and their subsequent decoding paths. If left unchecked, this branching would double the number of paths each at $i \in I$, leading to $2^k$ paths, corresponding to all $2^k$ possible data bit sequences, being considered. Since handling an exponentially increasing number of paths is impractical, the list-decoding approach culls the number of paths to a fixed-size list of the most likely partial paths after the doubling of paths from the branching for each $i \in I$. This procedure produces a fixed-size list of full decoding paths to consider, from which the most likely full path is selected to produce the estimated data sequence.

While the ultimate objective may be to make a hard-decision for the estimate of the original data symbols, it may also be useful to have a decoder that outputs soft-decision information ("soft-outputs") that represent estimated beliefs or likelihoods about the data symbols and/or code symbols. Soft-output decoders are useful components in the construction of more complex receivers, e.g., for decoding concatenated ECCs, which are formed from multiple component ECCs that are combined into a higher performance code. Another example is a system employing iterative equalization and decoding.

Both the SC and SCL decoders provide only hard-decision outputs for polar encoded codewords. Some methods, e.g., soft cancelation (SCAN) decoding and belief propagation (BP) decoding, provide soft-decision information for the polar encoded codewords. However, those methods require multiple iterations to generate each set of soft-outputs, and, thus, time, memory, and computational power expensive.

Accordingly, there is a need for a system and method for soft-output decoding of a codeword encoded with polar codes.

SUMMARY

Some embodiments are based on the realization that a list-decoding of successive cancellation (SCL) of a codeword encoded with a polar code can be modified to be used not only for hard-decision decoding, but for soft-output decoding. For example some embodiments use an SCL decoder to produce a list of candidate codewords and compare this list of candidate codewords against the soft-input of the decoder, i.e., the noisy codeword received from the communication channels, in order to generate soft-outputs. The embodiments determine the soft-output based on results of the comparison.

For example, one embodiment determines the distance of each candidate codeword of the SCL decoding from the soft-input to the decoder and determines a likelihood of a value of a bit in the sequence of bits using a difference of distances of the candidate codewords closest to the received codeword and having opposite values at the position of the bit. For example, at each bit position of the candidate codeword and/or the soft-input, the embodiment calculates a soft-output based on the difference of the distance of the closest candidate with a "1" at that location and the distance of the closest candidate with a "0" at that location. In such a manner, the embodiment determines the soft-output based on results of the entire SCL decoding, while avoiding separate iterations for determination of the soft-output of each bit of the codeword.

Optionally, some embodiments use at least one cyclic redundancy check (CRC) code embedded in the codeword to validate partial decoding paths via the CRC codes. Using the CRC embedded within the codeword, as contrasted with CRC embedding at the end of the codeword, assists the SCL decoder in pruning candidate codewords at intermediate steps in the decoding procedure. This also allows error propagations in SCL decoding.

In some implementations, when all of the candidates agree for a particular location, the magnitude of the soft-output is set to a parameter $\beta$. Additionally or alternatively, in some implementations, the soft-output is further scaled by a parameter $\alpha$.

Accordingly, one embodiment discloses a receiver for decoding an encoded codeword transmitted over a communication channel. The receiver has a front end to receive over a communication channel a codeword including a sequence of bits modified with noise of the communication channel, wherein the codeword is encoded with a polar code; and a soft decoder including a processor to produce a soft output of the decoding, wherein the processor is configured for estimating possible values of the bits of the received codeword using an SCL decoding to produce a set of candidate codewords; determining a distance between each candidate codeword and the received codeword; and determining a likelihood of a value of a bit in the sequence of bits using a difference of distances of the candidate codewords closest to the received codeword and having opposite values at the position of the bit.

Another embodiment discloses a method for decoding an encoded codeword transmitted over a communication channel, including receiving over a communication channel a codeword including a sequence of bits modified with noise of the communication channels, wherein the codeword is encoded with a polar code; estimating possible values of the bits of the received codeword using an SCL decoding to produce a set of candidate codewords; determining a distance between each candidate codeword and the received codeword; and determining a likelihood of a value of a bit in the sequence of bits using a difference of distances of the candidate codewords closest to the received codeword and having opposite values at the position of the bit. At least some steps of the method are performed using a processor.

Yet another embodiment discloses a non-transitory computer readable storage medium embodied thereon a program executable by a processor for performing a method, the method includes receiving over a communication channel a codeword including a sequence of bits modified with noise of the communication channel, wherein the codeword is encoded with a polar code; estimating possible values of the bits of the received codeword using an SCL decoding to produce a set of candidate codewords; determining a distance between each candidate codeword and the received codeword; and determining a likelihood of a value of a bit in the sequence of bits using a difference of distances of the candidate codewords closest to the received codeword and having opposite values at the position of the bit.

DETAILED DESCRIPTION

Figure 1:
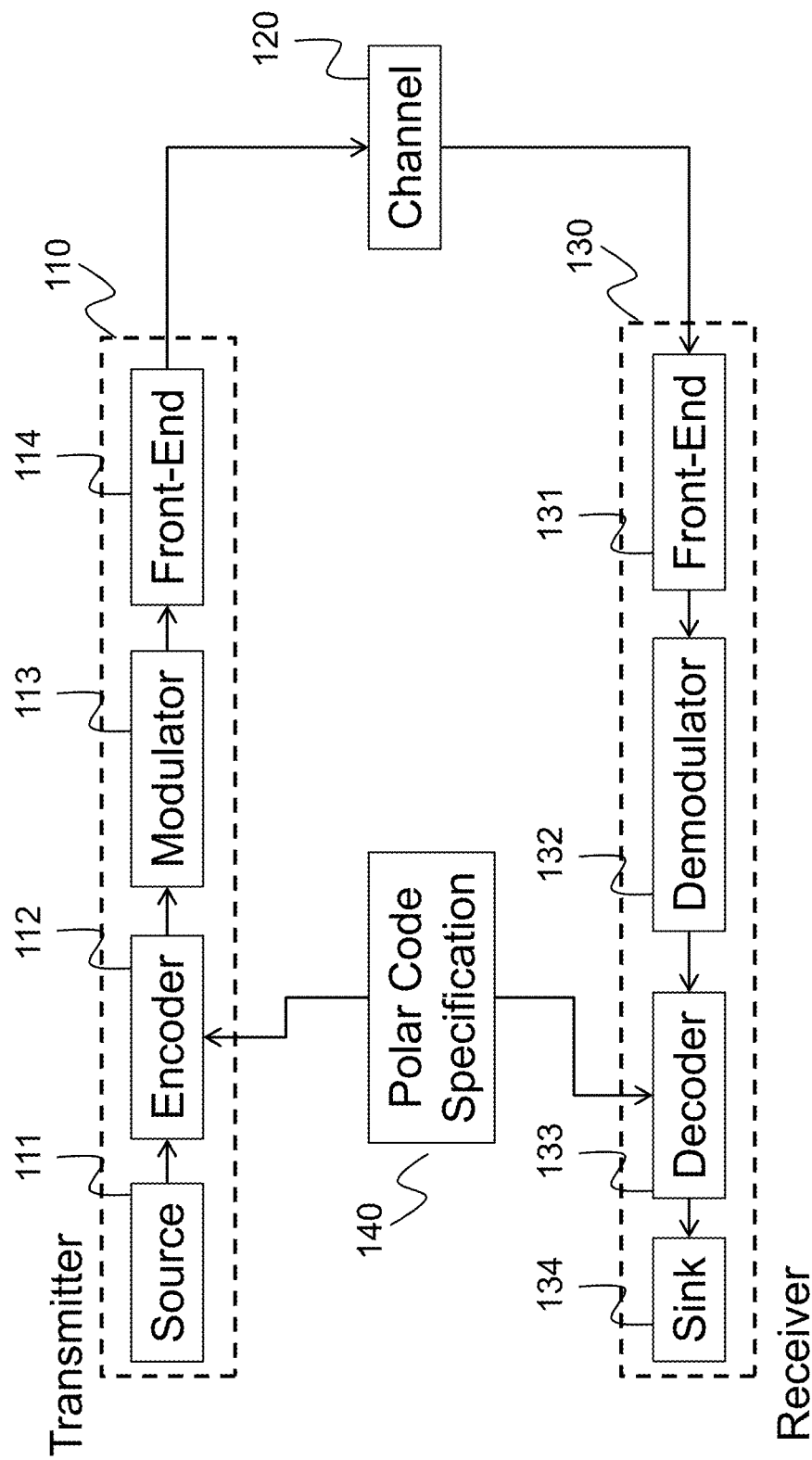
FIG. 1 is a function diagram of a communications system for transmissions of digital data according to some embodiments.

FIG. 1 shows a communications system for transmissions of digital data from a transmitter 110 to a receiver 130 over a channel 120 according to some embodiments. For example, the communication channel 120 includes air medium for radio communications, copper cable for wired communications, solid-state drive for data storage transferring, and fiber cable for fiber-optic communications. During the communications, the digital data can be corrupted by noise in the channel. The transmitter 110 uses a forward-error correction (FEC) code such as a polar code 140 to realize reliable data transmissions. The receiver tries to recover the data by using a decoder 133.

At the transmitter 110, the data to be sent comes from a source 111 configured to accept the original data. The source can include a memory to store the data, an input port to receive the data, and/or a device to generate the data. For example, in one embodiment, the source includes a voice communication device transforming an input voice signal into the digital data. The source data are encoded by an FEC encoder 112. The encoded data are modulated by a modulator 113. The modulator uses various digital modulation formats such as quadrature-amplitude modulation (QAM) with and without linear transforms such as orthogonal frequency-division multiplexing (OFDM). The modulated data are transmitted into the channel via front-end circuits 114, which can include electro-optic devices for optical communications and radio-frequency devices for radio communications. The front-end can also include signal pre-processing such as band-pass filter, precoding, power loading, pilot insertion, and pre-distortion.

The channel 120 distorts the transmitted signal. For example, the channel adds additive white Gaussian noise (AWGN), co-channel interference (CCI), deep fading, impulsive noise, inter-symbol interference (ISI), nonlinear interference (NLI) due to Kerr effect, and linear chromatic dispersion (CD).

The receiver 130 first converts the channel output into electrical received signals via front-end circuits 131, which are typically complementary of the front-end 114 at the transmitter. For example, the front-end includes linear equalization, nonlinear equalization, adaptive filtering, channel estimation, carrier phase recovery, synchronization, and polarization recovery. The received signals are demodulated at a demodulator 132 to produce an initial estimate of the bits of the transmitted codeword, which are used by the decoder 133 for recovering the source data. In various embodiments, the decoder 133 is a soft-output decoder for polar codes 140. The decoded data are sent to a data sink 134. In some embodiments, the decoder 133 is a hard-decision decoder to produce values indicative of log-likelihood ratio of the bits from the received codeword. In some other embodiments, the decoder 133 includes a combination of the soft-decision decoder to produce a soft output of the decoding and the hard-decision decoder to produce values indicative of log-likelihood ratio of the bits from the received codeword based on the soft output received from the soft decoder.

The transmitter 110 and/or the receiver 130 can be implemented using a processor operatively connected to a memory. For example, the memory of the receiver 130 can store some information related to one or combination of the polar coding, the soft input and the soft output of the decoder 133, results of intermediate calculations and parameters of the decoding. For example, the polar encoded codeword can be encoded using an encoding matrix formed as a Kronecker power of a lower-triangular matrix of ones. To that end, the memory of the receiver can store the encoding matrix used by the processor of the soft decoder to decode the codeword.

Figure 2:
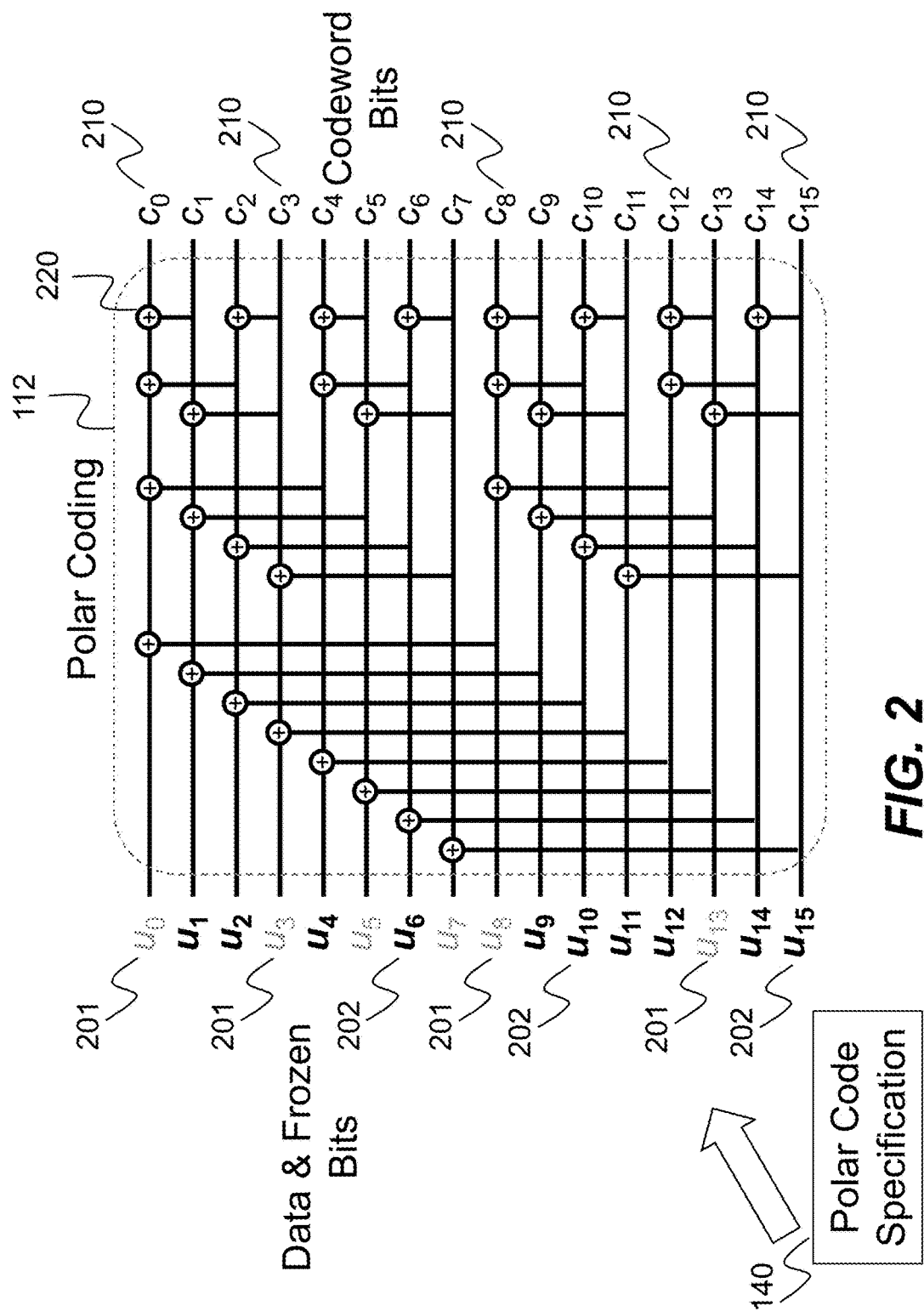
FIG. 2 is a schematic of an exemplar encoding employed by an encoder of the system of FIG. 1.

FIG. 2 shows a schematic of an exemplar encoding employed by the encoder 112 for an example polar code where there are n=16 codeword bits 210, k=10 data bits 202, and n−k=6 frozen bits 201. The 10 data bits are written to the locations of the data bits 202, while the frozen bits 201 are set to fixed, known values (which can be all zeros for simplicity in practice). Thus, in this example, the vector $u:=(u_0, \ldots, u_{n-1})$ is formed by setting the bits $(u_1, u_2, u_4, u_6, u_9, u_{10}, u_{11}, u_{12}, u_{14}, u_{15})$ to the values of the 10 data bits, the remaining bits $(u_0, u_3, u_5, u_7, u_8, u_{13})$ to fixed, known values. The data index set is I={1,2,4,6,9,10,11,12,14,15}, for this example, which along with the parameters n, k, and the fixed values of the frozen bits comprise the polar code specification 140. The schematic illustrates procedure to transform the vector $u:=(u_0, \ldots, u_{n-1})$ into the codeword vector $c:=(c_0, \ldots, c_{n-1})$, which involves employing the binary exclusive-or (XOR) operation 220 as shown. These operations follow a structured pattern such that the overall procedure is equivalent to the application of the formula $c = uBF^{\otimes m}$, where the matrix multiplications are carried out over the binary field (i.e., modulo-2 arithmetic), B denotes the n×n bit-reversal permutation matrix, and $F^{\otimes m}$ is the m-th Kronecker power of the matrix $$F := \begin{bmatrix} 1 & 0 \\ 1 & 1 \end{bmatrix},$$

and $m := \log_2 n$ is the number of polarization stages. For regular polar coding, there are $$\frac{n}{2}$$

times XOR operations per stage, resulting to nm/2 operations in total. Each XOR operation is referred herein a polarization operation for convenience because this operation creates upgraded sub-channel and downgraded sub-channel like a polarizer.

Figure 3:
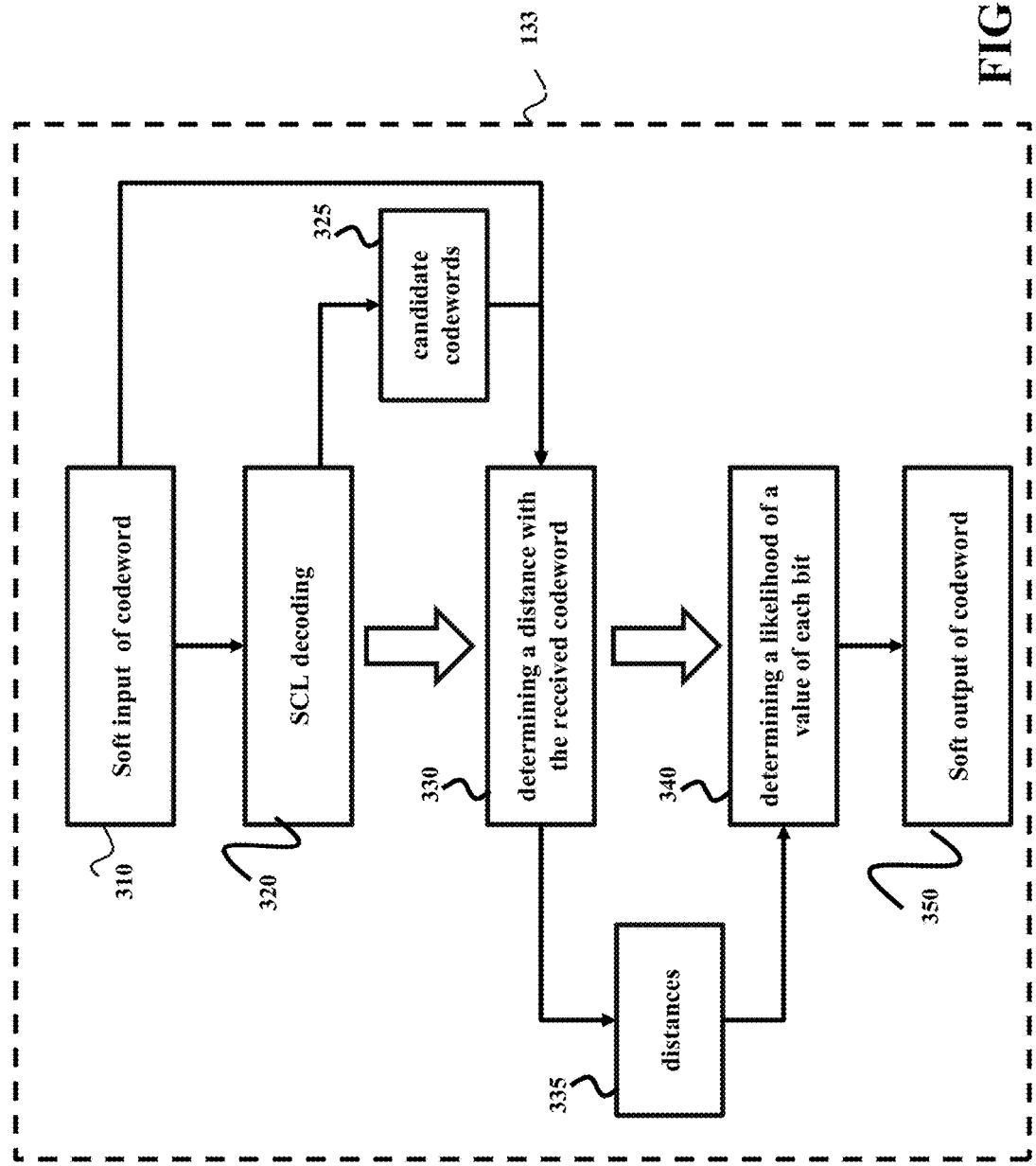
FIG. 3 is a block diagram of a method for a soft decoding performed by the soft decoder according to one embodiment.

FIG. 3 shows a block diagram of a method for a soft decoding performed by the soft decoder 133 according to one embodiment. The decoder 133 can include a processor operatively connected to a memory and configured for implementing the steps of the method.

The method estimates possible values of the bits of the received codeword 310 using a successive cancelation list (SCL) decoding 320 to produce a set of candidate codewords 325 and determines 330 a distance between each candidate codeword 325 and the received codeword 310 to produce a corresponding set of distances 335. The method determines 340 a likelihood 350 of a value of a bit in the sequence of bits using a difference of distances of the candidate codewords closest to the received codeword and having opposite values at the position of the bit. For example, one embodiment calculates a soft output at each bit position of the soft input based on the difference of the distance of the closest candidate with a "1" value at that position and the distance of the closest candidate with a "0" at that position.

Figure 4:
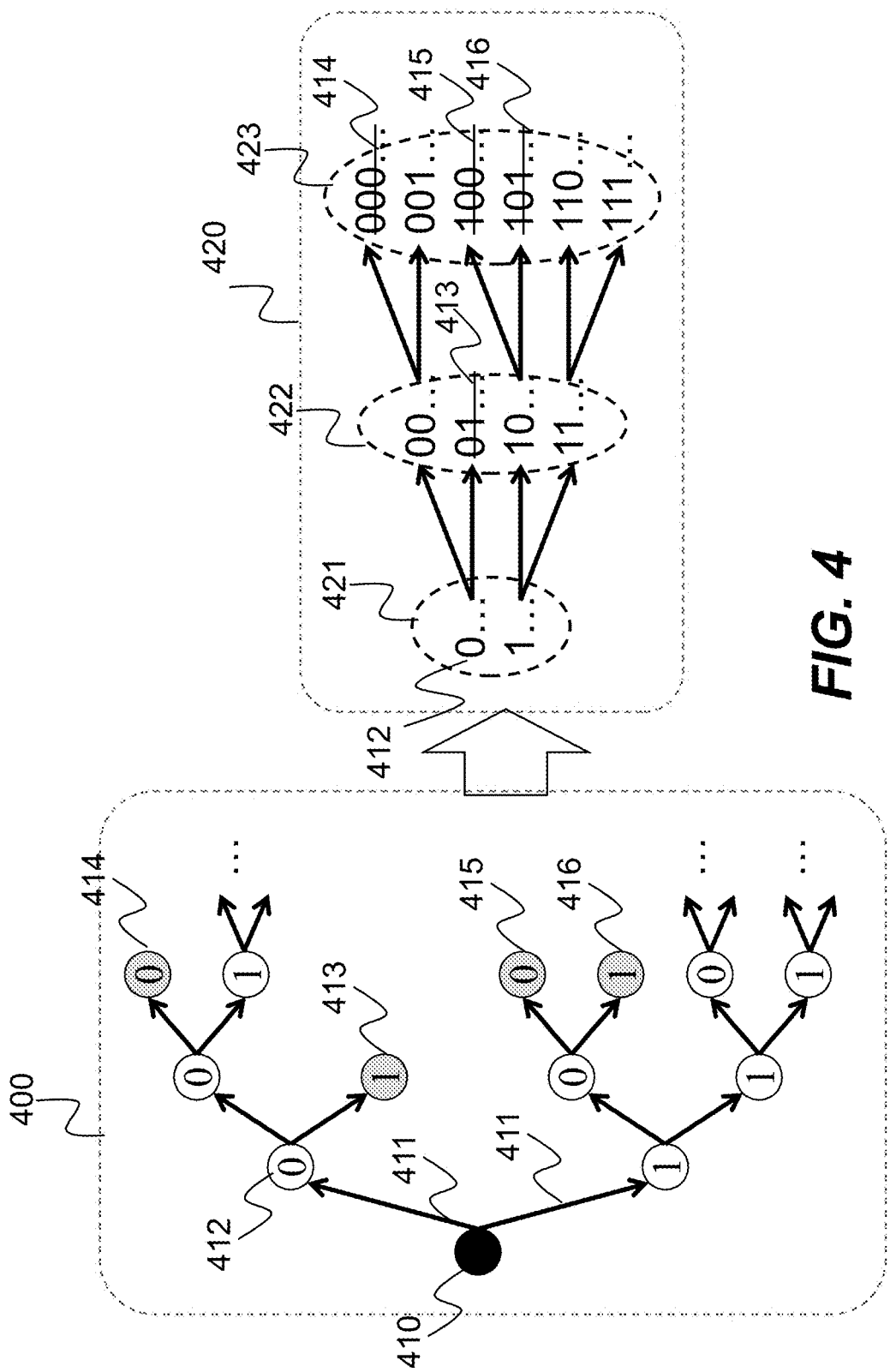
FIG. 4 is a schematic of list decoding generating the list of candidate decoding paths according to some embodiments.

FIG. 4 shows a schematic of SCL decoding 320 generating the list of candidate decoding paths 420 by considering multiple decoding paths in a tree structure 400 according to some embodiments. The decoding process begins with the branching 411 from the beginning empty path 410 to consider the both possibilities of the first bit, to generate the initial two candidates 421 in the list of decoding paths. The candidate path "0 . . . " 412 is in the list 421 and corresponds to a position within the tree structure 400. For subsequent bits locations, each of the candidate decoding paths in the list is branched to condition both possibilities of the next bit. For example, the candidates in the list are branched to progress from considering the first bit location 421 to the second bit location 422, and from considering the second bit location 422 to the third bit location 423. This corresponds to the branching seen in the tree structure 400. Since the branching causes the list size to grow, this growth is limited by restricting the list of candidates to a fixed size. In the example illustrated in this figure, the list is limited to a size of three. After the second branching, one candidate path 413 is removed from the list. After the third branching, three candidate paths 414, 415, and 416 are removed from the list.

Figure 5:
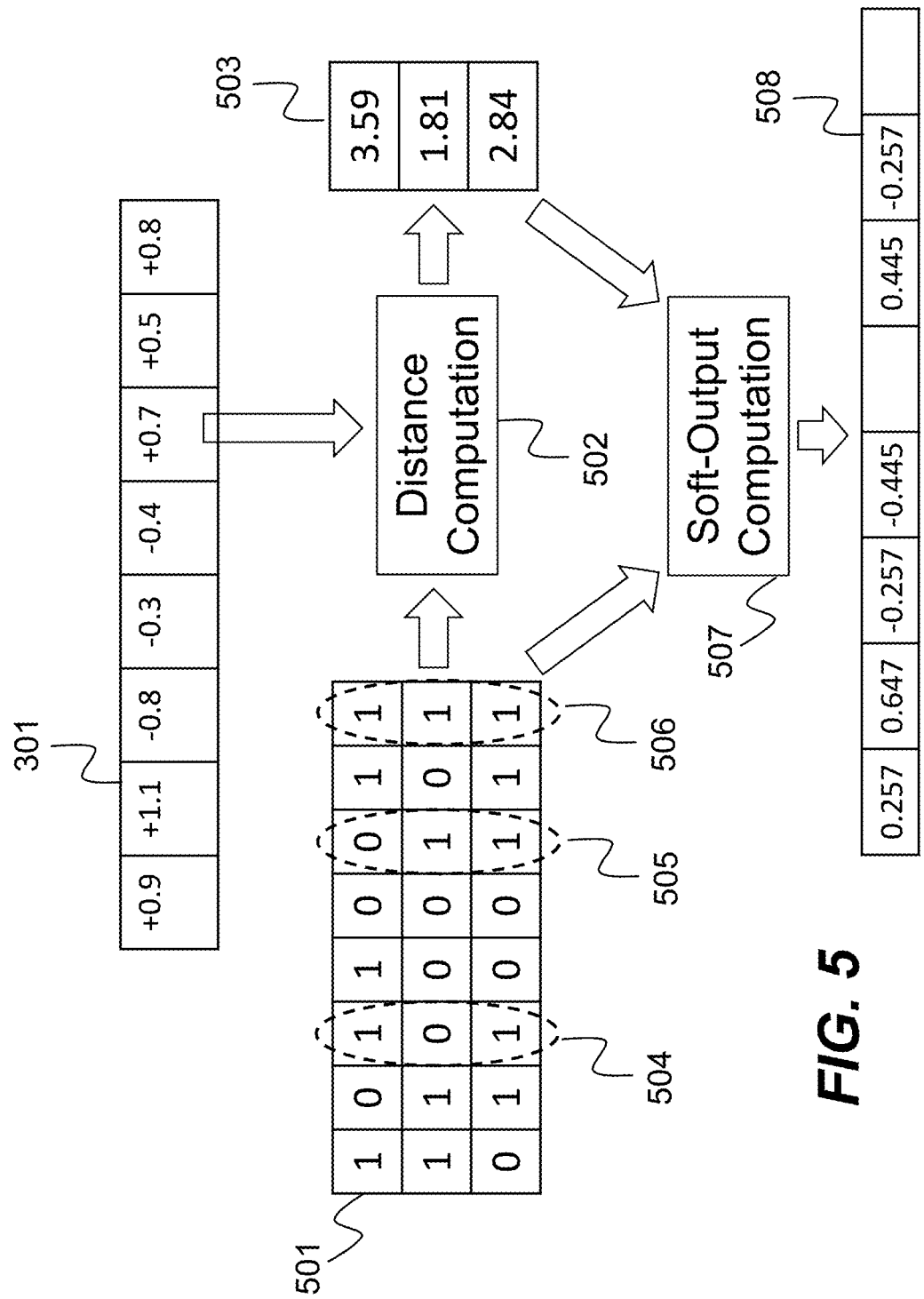
FIG. 5 is an example of the computation of distances between the set of candidate decoded codewords and the soft-input for determining the soft-output for each bit location using principles of some embodiments.

FIG. 5 shows an example of the computation of distances between the set of candidate decoded codewords 501 and the soft-input 301 for determining the soft-output for each bit location using principles of some embodiments. In this example, the list of candidate codewords 501 includes three candidates and the distance is determined as a squared distance. To that end, the squared distance of each candidate is computed 502 with respect to the soft-input 301. In different embodiments, the number of candidates and the metric for distance determination can vary.

Let $(y_1, \ldots, y_n)$ denote the soft-input 301, and let $(c_1, \ldots, c_n)$ denote a particular candidate decoded codeword. The squared distance is calculated according to squared Euclidean distance formula $\sum_{i=1}^{n}(y_i-(2c_i-1))^2$. Note that each candidate is converted from the binary values $\{0,1\}$ to $\{-1, +1\}$ by the term $(2c_i-1)$. The calculation process 507 of the final soft-output 508 is then performed individually over each bit location based on the list of candidate codewords 501 and their respective squared distances 503. For each bit location, the soft-output is computed from a function of the difference of squared distance of the closest candidate with a zero in that location and the squared distance of the closest candidate with a one in that location. This is given by the formula $o_i=f(d_{i,0}-d_{i,1})$, where $o_i$ is the soft-output for bit location i, $d_{i,0}$ is the squared distance of the closest candidate with a zero in location i, and $d_{i,1}$ is the squared distance of the closest candidate with a one in location i.

For example, in one embodiment, the function includes the difference of the distances divided by a scalar, e.g., $o_i=(d_{i,0}-d_{i,1})/4$ (where in this example, the scalar is 4). For example, a soft output of a bit at a location 504 is (1.81−2.84)/4=−0.257, wherein 1.81 is the distance of the only candidate codeword with value zero at the location 504 and 2.84 is the distance of the closest candidate with values one at the location 504. For example, a soft output of a bit at a location 505 is (3.59−1.81)/4=0.445, wherein 3.59 is the distance of the only candidate codeword with value zero at the location 505 and 1.81 is the distance of the closest candidate with values one at the location 505.

In some embodiments, if all of the candidates have the same value at that bit location, such as the bit at the location 506, then this formula cannot be applied, and instead the soft-output for that location is set according to a given parameter $\beta>0$, with the output set to $o_i=+\beta$ if all of the candidates have the value one in that location, or $o_i=-\beta$ if all of the candidates have the value zero in that location.

To further increase the error correction performance, some embodiments at the cost of a small reduction in coding efficiency, embed a cyclic redundancy check (CRC) in the data bits. With this change, the decoder can be modified (referred to as SCL+CRC) so that if at least one of paths corresponds to a data sequence with a valid CRC, then the most likely path with a valid CRC is instead selected for the estimate.

Figure 6A:
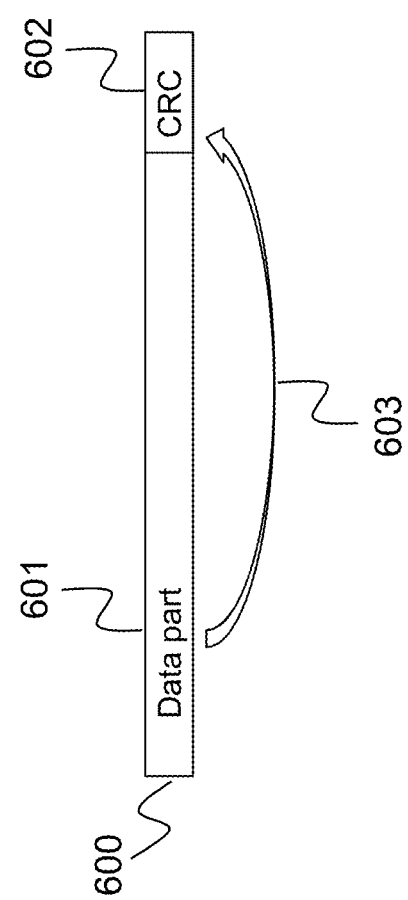
FIGS. 6A and 6B are schematics of embedding of multiple CRC codes in the data bits of the codeword.
Figure 6B:
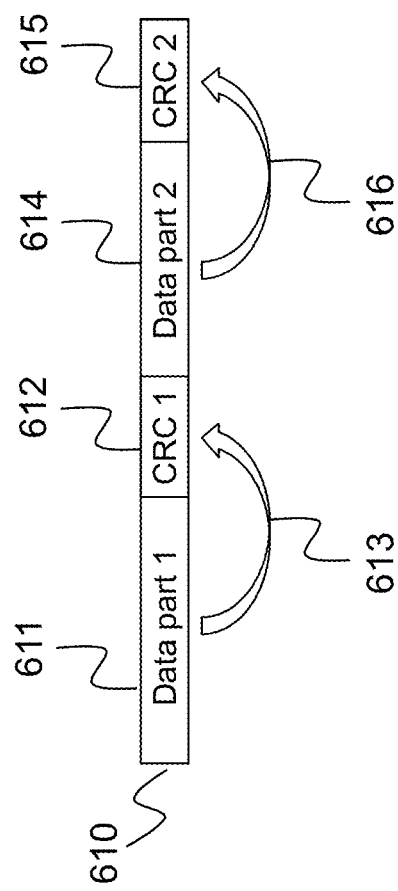

FIGS. 6A and 6B show schematics of embedding of at least one CRC code in the data bits of the codeword. For example, FIG. 6A shows an example where one CRC is embedded at the end of the codeword to validate the correctness of the decoding. In this example, the bits of the codeword 600 are split into a single data part 601, containing actual message data, followed by a single CRC code 602 that is computed from and verifies 603 the data part 601.

FIG. 6B shows an example using multiple CRC codes, where the first CRC is embedded in the middle of the codeword to improve performance of SLC decoding, and the second CRC at the end of the codeword. Such multiple CRC codes embedded within the codeword can be used to validate partial decoding paths. In such a manner, the CRC can assist the SCL decoder in pruning candidate codewords at intermediate steps in the decoding procedure. In addition, multiple CRC codes can prevent potential error propagation in the SCL decoding.

In the bits of the codeword 610 multiple CRC codes are embedded splitting the codeword 610 into four parts. A first data part 611 is followed by a first CRC part 612 computed from and verifies 613 the first data part 611. The second data part 614 is followed by a second CRC part 615 computed from and verifies 616 the first data part 614.

Figure 7:
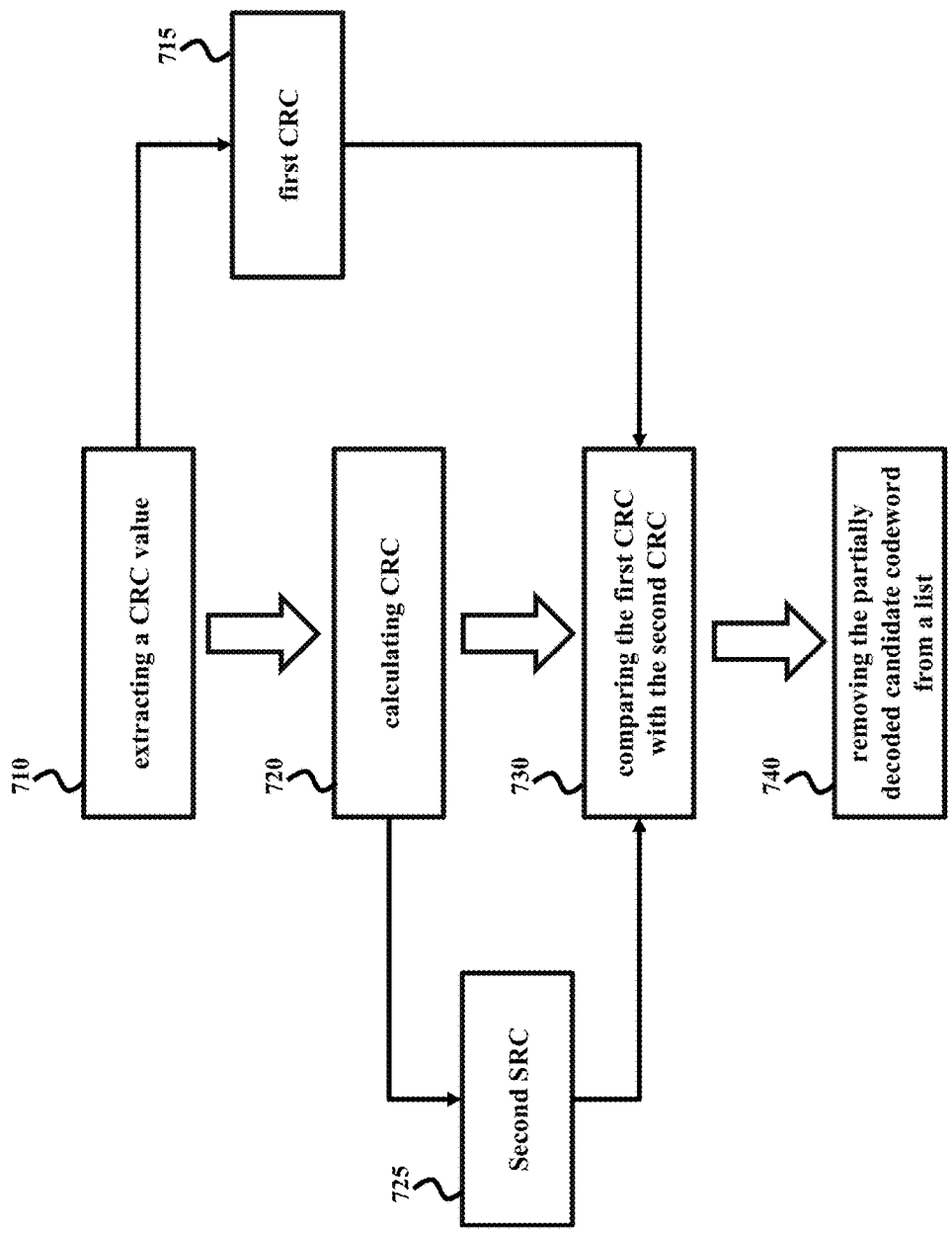
FIG. 7 is a block diagram of a method for soft decoding according to some embodiments.

FIG. 7 shows a block diagram of a method for soft decoding according to some embodiments, where the received codeword includes a plurality of CRC codes. For example, in one embodiment the processor of the soft decoder 133 prunes the set of candidate codewords at a partial length governed by a place of inclusion of a CRC code in the received codeword when a part of a candidate codeword includes an incorrect CRC code.

For example, the method extracts 710 a CRC value from a partially decoded candidate codeword to produce a first CRC 715 and calculates 720 a CRC by applying a well-known CRC computation procedure the partially decoded candidate codeword to produce a second CRC 725.

The method compares 730 the first CRC 715 with the second CRC 725 and removes the partially decoded candidate codeword from a list of possible combinations of the decoded bits if the first CRC does not match the second CRC.

Figure 8:
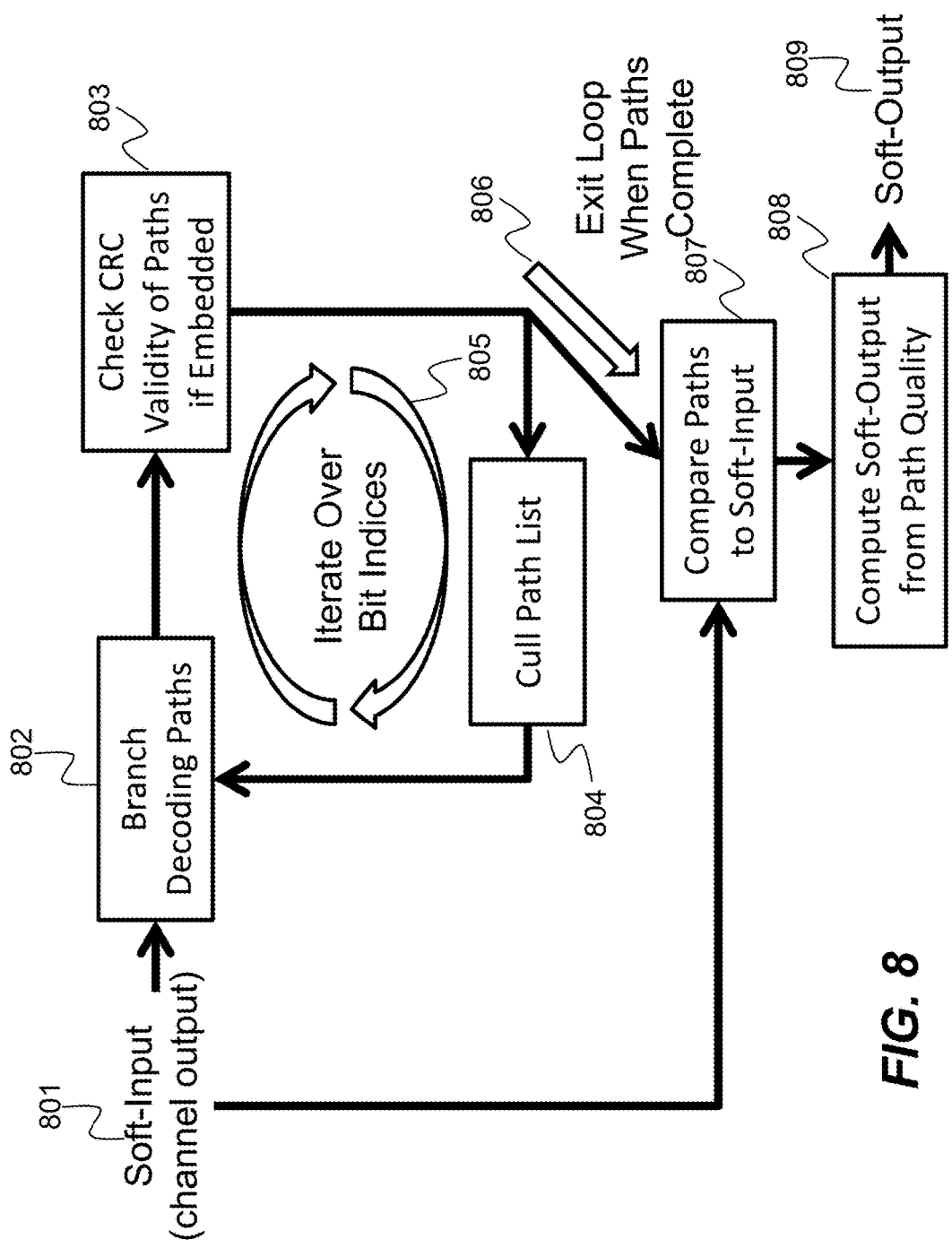
FIG. 8 is a block diagram of a method for decoding a codeword transmitted over a channel according to one embodiment.

FIG. 8 is a block diagram of a method for decoding a codeword transmitted over a channel according to one embodiment. The soft-input 801 to this procedure is the noisy codeword received over the channel, which is denoted by $y:=(y_0, \ldots, y_{n-1})$, where each $y_i$ is a noisy observation of the corresponding code bit $c_i$. The list decoding procedure proceed sequentially over the bits from index 0 to n−1, where in each iteration 805 for bit index $i \in \{0, \ldots, (n-1)\}$, the following is performed:

Branch decoding paths 802 at data bit indices:
  The list of decoding paths starts with one path if the first index is not a data bit location (i.e., $0 \notin I$), in which case the single path includes the estimate of the first bit $\hat{u}_0$ set to the known, fixed value of $u_0$. Otherwise, when the first index is a data bit location (i.e., $0 \in I$), the list of decoding paths starts with two paths, $\hat{u}_0=0$ and $\hat{u}_0=1$, representing the possibility that the first bit is either 0 or 1.
  At subsequent bit indices i>0, the existing paths are extended. If the bit index corresponds to a data bit location (i.e., $i \in I$), then each path is branched in two paths by adding $\hat{u}_i=0$ and $\hat{u}_i=1$, respectively, to each branch. Otherwise, when the bit index does not correspond to a data bit location (i.e., $i \notin I$), each path is not branched and only extended by adding $\hat{u}_i$ set to the known, fixed value of $u_i$ Check CRC validity of paths if embedded 803:
  If the data bits contain embedded CRC codes, then these can be used to reject invalid partially decoded paths.
  At bit indices i, where the data bit locations of the partial vector $(u_0, \ldots, u_i)$ contains an embedded CRC code, then the self-consistency of the partially decoded paths can be checked. Otherwise, nothing is done at this stage. Also, once a particular CRC code has been checked, it does not need to be rechecked for later indices.
  For each partial path $(\hat{u}_0, \ldots, \hat{u}_i)$, check that the bits at its data bit locations are self-consist with respect to the embedded CRC codes. The paths that are not self-consistent are removed from the list of paths.

Cull path list 804:
  To avoid handling and exponentially large (and hence intractable) list of candidate paths, the list is culled to a fixed list size limit L.
  For each partial decoded path $(\hat{u}_0, \ldots, \hat{u}_i)$, a relative statistical likelihood that this partial decoding path is correct, $P(y, \hat{u}0, \ldots, \hat{u}_{i-1}|\hat{u}_i)$, is calculated, which follows from the polar code structure and underlying channel statistics.
  Then, the L paths with the highest likelihoods are kept, while the remaining paths are removed from the list.

Exit loop when paths complete 806:
  The loop finishes after data index i=n−1 is considered, and the procedure moves onto comparing the candidate paths to the soft-input 807.

After comparing each candidate path to the soft-input 807, the soft-output 809 are computed based on the relative quality of the candidate paths 808.

Another embodiment uses look-up table (LUT) to propagate the reliability information across polarization stages, wherein quantized belief messages are statistically determined to minimize the required LUT memory size without incurring much performance penalty. The adaptive LUT output based on the likelihood statistics is used to refine the frozen bit location to achieve higher coding gain to compensate for the quantization loss.

In some embodiments, the calculation of bit likelihoods during decoding uses only a few quantization bits to reduce the computational complexity and memory. One embodiment uses an adaptive LUT for processing the decoding data at each polarization operation, by considering statistics of incoming and outgoing messages, not simply approximating the quantized version of likelihoods. For example, downgrading branch of polarization operator produces lower reliable messages, and thus the quantization dynamic range should be smaller than the upgrading branch of polarizers. Using different LUTs at different polarizers at the stage and bit index, the penalty of quantized decoding can be minimized.

Irregular Polar Code Construction

Some embodiments are based on recognition that the regular polar coding construction addresses the situation where the communication channels and modulation schemes provide uniform transmission reliability for each transmitted codeword bit. This assumption is required for theoretical proof of achieving capacity and frozen bit location design. However, some situations, such as higher-order modulation, frequency-selective fading, time-varying channels, and multi-input multi-output (MIMO) channels, result in non-uniform reliability across the transmitted bits. Some embodiments are based on another recognition that while the regular polar coding converges toward optimal coding efficiency over large (in theory infinitely large) codes, its practical error correction performance for shorter code lengths can be improved.

Some embodiments are based on realization that adaptability of the regular polar coding to the variations of the parameters of the communication channel depends on the values of parameters such as a parameter defining a number of data bits in the codeword, a parameter defining a data index set specifying locations of frozen bits in the encoded codeword, and a parameter defining a number of parity bits in the encoded codeword. Those parameters are referred herein as regular parameters of the polar code.

Some embodiments are based on realization that in addition to the regular parameters, some other parameters needs to be used to increase adaptability of the polar code. Such additional parameters can include one or combination of a parameter defining an irregularity of values of at least one regular parameter of the polar code, a parameter defining an irregularity of permutation of the encoded bits, a parameter defining an irregularity of polarization kernels in the polar code, and a parameter defining an irregularity in selection of de-activated XOR operations on different stages of the polar encoding, and wherein the irregular polar encoder encodes the codeword using the regular and the irregular parameters of the polar code.

These additional parameters are referred herein as irregular parameters. The polar code designed using regular and irregular parameters is referred herein as irregular polar code. A polar encoder that encodes a codeword using an irregular polar code is referred herein as irregular polar encoder.

Figure 9A:
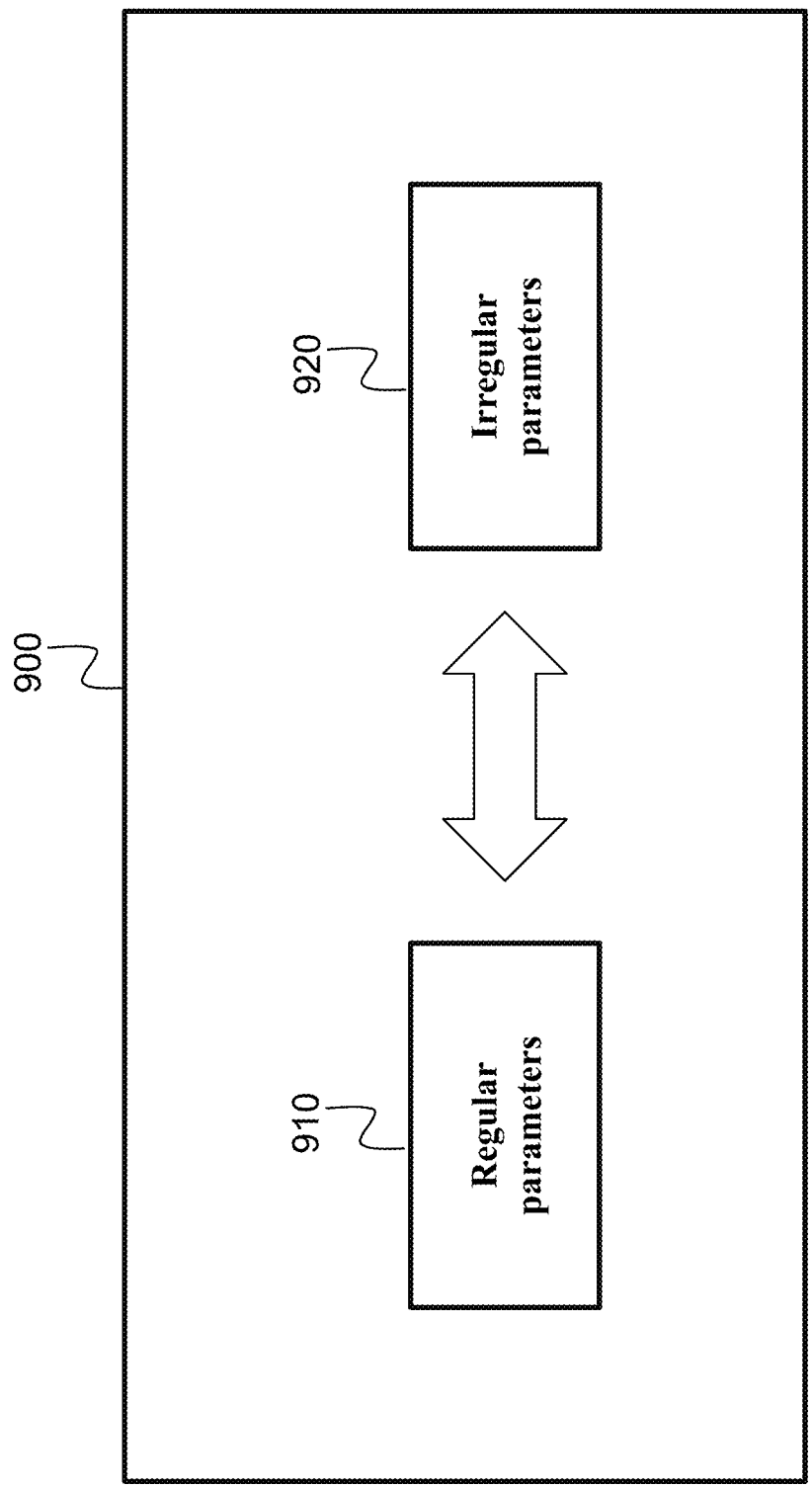
FIG. 9A is a schematic of an irregular polar encoder operated to encode the codeword with an irregular polar code according to some embodiments.

FIG. 9A shows a schematic of an irregular polar encoder operated by a processor to encode the codeword with an irregular polar code 900 to produce the encoded codeword according to some embodiments. The irregular polar encoder can be included into the encoder 112 of the transmitter 110.

The irregular polar code 900 is specified by a set of regular parameters 910 including one or combination of a parameter defining a number of data bits in the codeword, a parameter defining a data index set specifying locations of frozen bits in the encoded codeword, and a parameter defining a number of parity bits in the encoded codeword. The irregular polar code 900 is further specified by a set of irregular parameters 920 including one or combination of a parameter defining an irregularity of values of at least one regular parameter of the polar code, a parameter defining an irregularity of permutation of the encoded bits, a parameter defining an irregularity of polarization kernels in the polar code, and a parameter defining an irregularity in selection of de-activated XOR operations on different stages of the polar encoding. In some embodiment, the irregular polar encoder encodes the codeword using the regular and the irregular parameters of the irregular polar code.

Figure 9B:
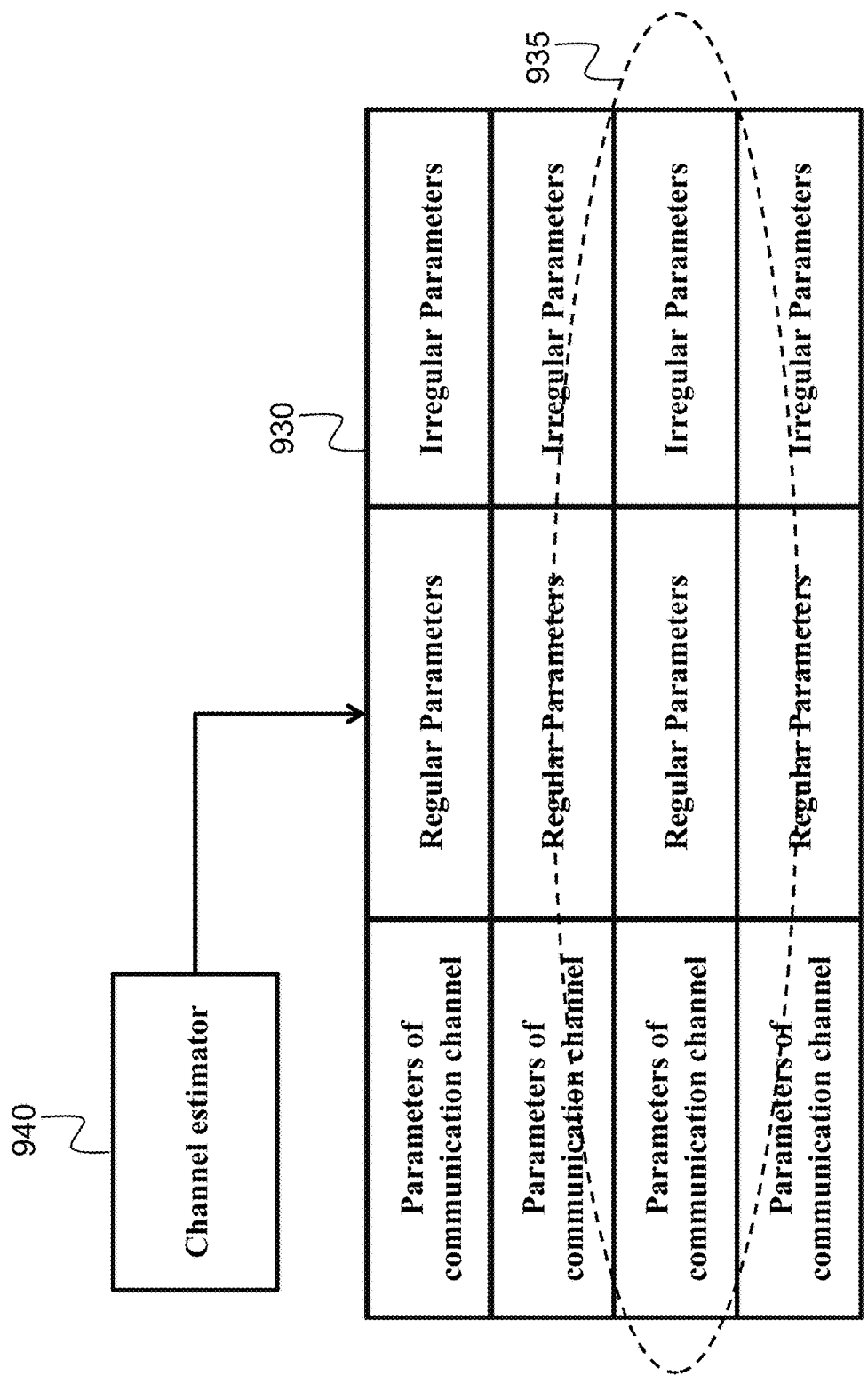
FIG. 9B is a schematic of determining parameters of the irregular polar code according to one embodiment.

FIG. 9B shows a schematic of determining parameters of the irregular polar code according to one embodiment. In this embodiment, the transmitter 110 includes a channel estimator 940 configured to determine parameters of the communication channel. For example, the parameters of the communication channel include values of non-uniform reliability for transmission of bits of the encoded codeword and/or other statistics of the channel such as signal-to-noise ratio and delay profile. The parameters of the communication channel can be determined using various methods such as least-squares channel estimation based on pilots and training symbols or a blind power estimation.

In one embodiment, the transmitter 110 includes a memory to store a mapping 930 between different values of regular and/or irregular parameters to different values of the parameters of the communication channel. In such a manner, the embodiment can select a combination 935 of values of the regular parameters and/or the irregular parameters of the polar code based on the parameters of the communication channel determined by the channel estimator 940.

In some situations, the performance of polar codes depends not only decoding methods but also frozen bit locations at encoder. To facilitate the soft-decision decoding, frozen bit locations are further refined so that the polarization effect can be boosted up, by dealing with the statistics of the likelihoods during soft-decision decoding. The frozen bit location design is particularly important for high-order modulation and frequency-selective fading channels, where different coded bits are corrupted with different noise strengths, causing non-uniform bit reliabilities. The embodiment exploits the knowledge of statistics of likelihoods for selecting frozen bit locations to improve the performance of soft-decision decoding. In addition, how to map the coded bits onto which modulation bit is important for such non-uniform reliability because different mapping can degrade the polarization effect. Therefore, careful interleaving design to map the coded bits onto modulation bits is required besides the frozen bit location design. The method of the invention provides the way to jointly design the frozen bit locations and interleaving for such high-order modulation and fading channels.

Figure 10A:
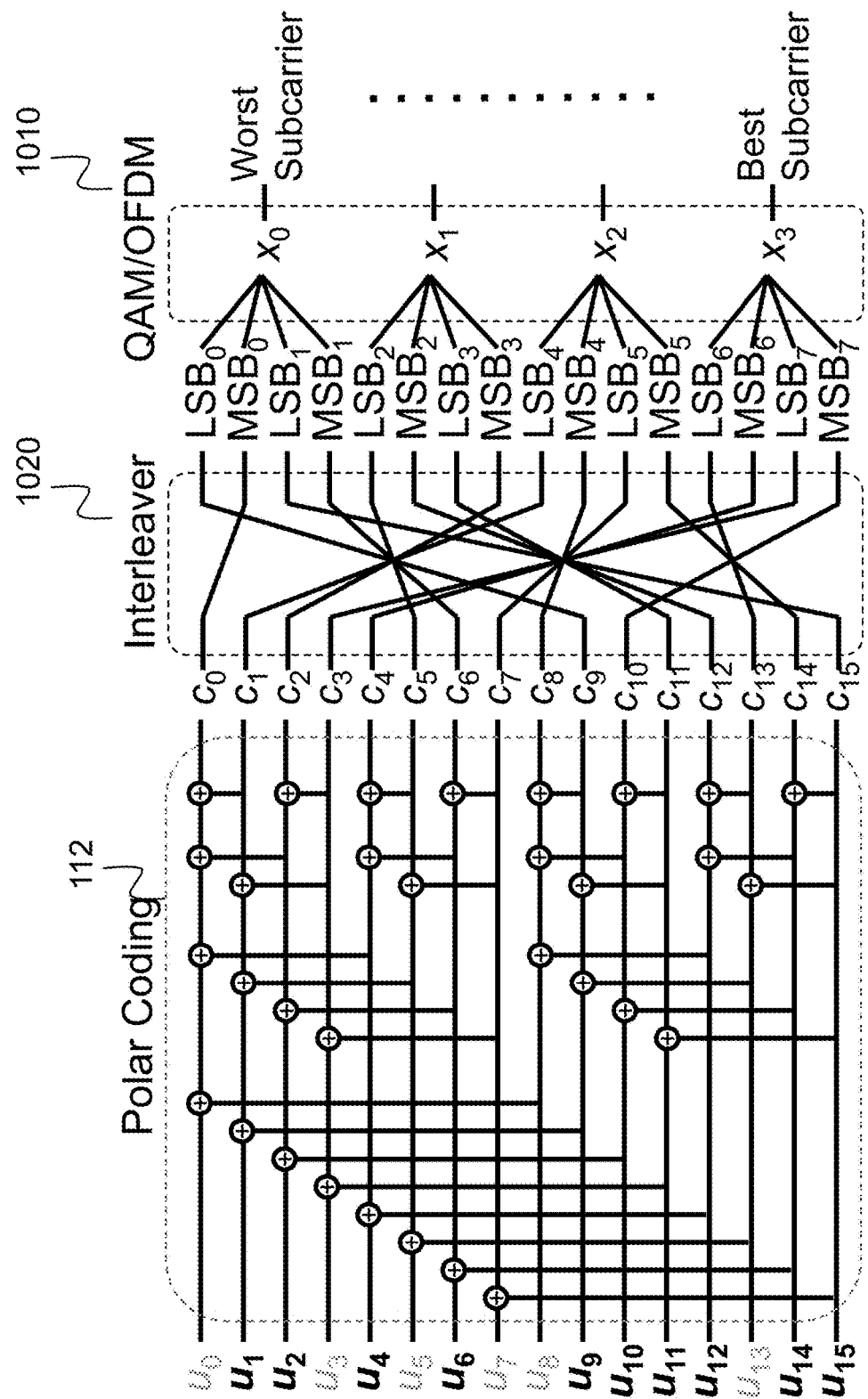
FIG. 10A is a schematic of bit-interleaved polar-coded modulation for non-uniform channels according to some embodiments.

FIG. 10A shows the schematic of encoder with interleaving, where polar coding 112 produces the coded bits $c_0, \ldots, c_{15}$, which are mapped by an interleaver 1020 to different modulation bits at QAM modulator or OFDM modulator 1010, across the least-significant bit (LSB) to the most significant bit (MSB) planes. LSB to MSB have different bit reliabilities. Besides bit significance, each modulated symbol $x_0, \ldots, x_3$ may have different channel noise level, e.g., due to frequency-selective fading channels. The method of the invention carefully maps the important coded bits to the reliable modulation bits so that high decoding performance is realized.

Figure 10B:
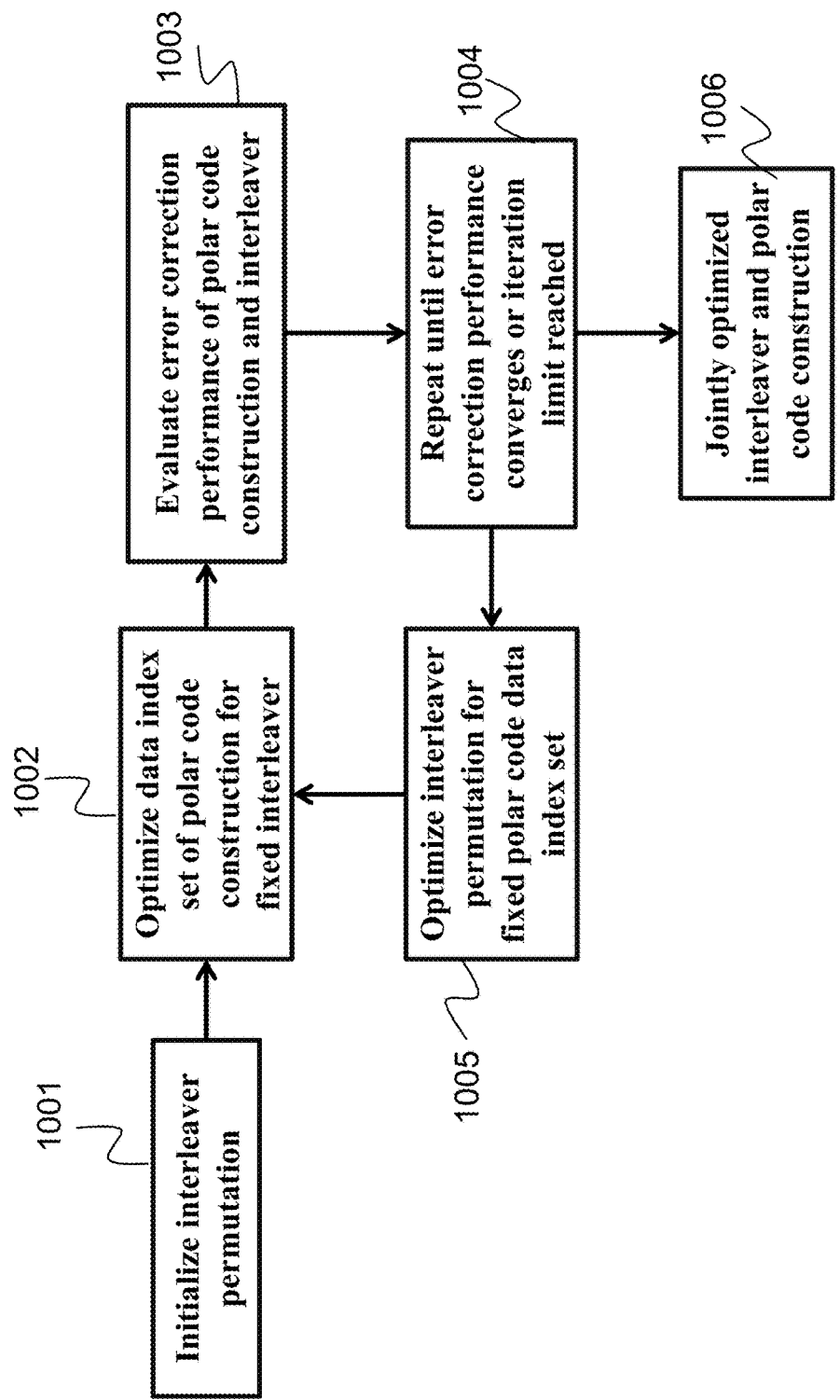
FIG. 10B is a block diagram of the joint optimization procedure for the interleaver and polar code construction for non-uniform channels according to some embodiments.

FIG. 10B shows the procedure jointly optimizing the interleaver and polar code construction for non-uniform channels. This method employs an interleaver scheme where the permutation performed by the interleaver is parameterized by a set of parameters that can be tractably optimized, that is, instead of considering all possible permutations. For example, one realization of interleaving is the quadratic polynomial permutation (QPP) interleaver, which re-orders the coded bit index i to the modulation bit index as follows:

$$\Pi_{QPP}(i) = (f_0 + f_1 i + f_2 i^2) \mod n,$$

where $(f_0, f_1, f_2)$ are the interleaver parameter. Before and after the QPP interleaving, short lexicographical permutation tables can be used so that more degrees of freedom to design the interleaving for polar coding.

First, the interleaver is set to an initial permutation 1001. Then, the polar code construction is optimized for this initial interleaver permutation 1002, by selecting the data index set corresponding to the most-reliable pseudo-channels. Then, the error correction performance of polar code construction and interleaver is evaluated 1003. This evaluation could be performed empirically via simulations and/or analytically via the error bound computable from reliability of the pseudo-channels selected by the data index set. For example, at each polarization operation, the statistics of the likelihood can be traced by the Bhattacharyya parameter, the density evolution, the Gaussian approximation, or the extrinsic information transfer (EXIT) methods. In order to capture the non-uniform reliability, the method of one embodiment uses un-conventional tracing. For example, the Bhattacharyya parameter is traced as follows:

$$Z_i^{m-1} = Z_i^m + Z_j^m - Z_i^m Z_j^m, \quad Z_j^{m-1} = Z_i^m Z_j^m,$$

respectively, for downgrading branch i and upgrading branch j, where $Z_i^m$ is the Bhattacharyya parameter at the polarization stage m for the bit index i. The Bhattacharyya parameter corresponds to upper bound of bit error rate.

In some embodiments, in order to consider soft-decision message propagation, the EXIT method traces the reliability across decoding stages as follows:

$$R_i^{m-1} = 1 - J_{TB}(\sqrt{[J_{TB}^{-1}(1-R_i^m)]^2 + [J_{TB}^{-1}(1-R_j^m)]^2}),$$

$$R_j^{m-1} = J_{TB}(\sqrt{[J_{TB}^{-1}(R_i^m)]^2 + [J_{TB}^{-1}(R_j^m)]^2}),$$

respectively for the downgrading branch and upgrading branch of polarization operation, where $R_i^m$ is the mutual information propagated from the channel output. Here, $J_{TB}(\cdot)$ and $J_{TB}^{-1}(\cdot)$ denote the ten Brink's J-function and its inverse function, i.e., $$J_{TB}(x) = 1 - \int_{-\infty}^{\infty} \frac{1}{\sqrt{2\pi x^2}} e^{-\frac{\left(t-\frac{x^2}{2}\right)^2}{2x^2}} \log_2(1+e^t) dt.$$

Once we calculate the mutual information after decoding, the error rate at i-th input bit is obtained by $$P_i = \frac{1}{2}\mathrm{erfc}\left(\frac{1}{2\sqrt{2}} J_{TB}^{-1}(R_i^1)\right),$$

where erfc(x) is the complementary error function. Note that the mutual information calculation at each polarization stages should take into account the non-identical LUTs for quantized soft-decision decoding. Specifically, the above J-function is modified from continues Gaussian function to discrete-input and discrete-output function, whose mutual information can be readily calculated by the corresponding transition matrix. In addition, the EXIT trace equation is modified for different decoding methods such as belief propagation decoding, where the EXIT equation is modified to consider additional feedback information from adjacent polar stages. Note that the EXIT trace equation is readily generalized for different decoding algorithms such as BP decoding by considering feedback information from the next polarization stages in addition to the previous polarization stages.

Next, a decision to continue or end the iterative optimization procedure is made 1004, based on whether the error correction performance has converged (i.e., not changing significantly with respect to previous iterations) or if a limit on the total number of iterations has been reached. If continuing, the interleaver permutation is optimized while the polar code data set index is kept fixed 1005, then the polar code data set index is again optimized while the interleaver is kept fixed 1002, then the performance of the polar code construction and interleaver is reevaluated 1003, and a decision to continue or end the iterative optimization is again made 1004. After ending these iterations, the final result is the jointly optimized interleaver and polar code construction 1006. This joint optimization of frozen bit locations and interleaving provides boosted polarization effect especially for longer codeword lengths and wireless fading channels.

In some embodiments, a plurality of polar codes is used, where each component polar code is mutually concatenated, and soft-decision decoding output are propagated back and forth across multiple polar decoders. The benefits of multiple concatenated polar codes include the capability of parallel decoding, increased error correction potential, and decreased decoding latency.

Figure 11:
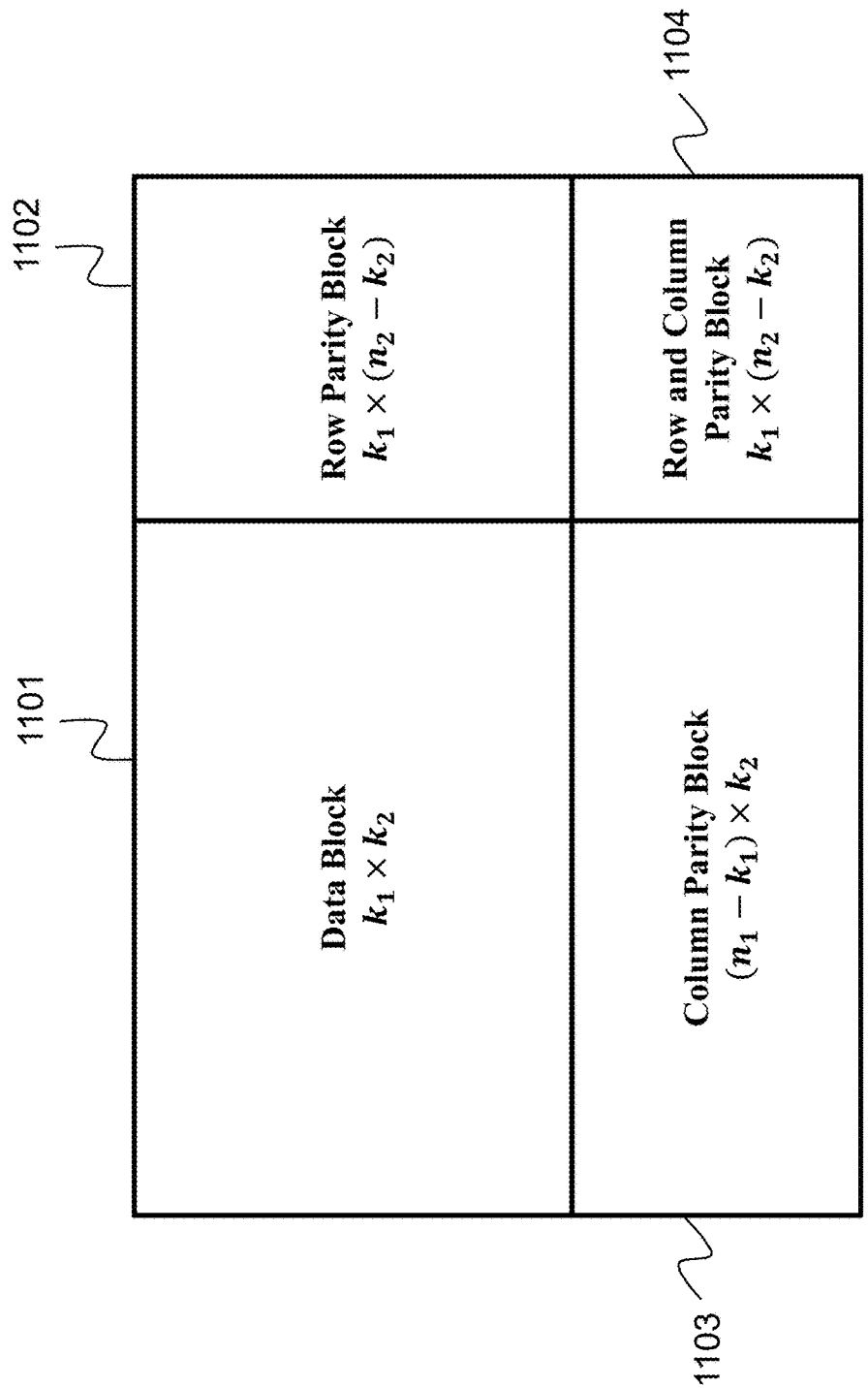
FIG. 11 is an illustration of an example concatenated error correcting code with a product coding structure according to some embodiments.

FIG. 11 illustrates an example concatenated polar code with a product coding structure. The product coding structure employs two polar codes, the first with length $n_1$ and $k_1$ data bits, and the second with length $n_2$ and $k_2$ data bits. The encoding procedure encodes $k_1 \times k_2$ data bits, arranged in rectangular data block 1101 with $k_1$ rows and $k_2$ columns. The row parity block 1102 is produced by systematically encoding each row of the data block 1101 with the second polar code, and writing the computed parity bits for each row into the corresponding row of the $k_1 \times (n_2-k_2)$ row parity block 1102. The column parity block 1103 is produced by systematically encoding each column of the data block 1101 with the first polar code, and writing the computed parity bits for each column into the corresponding column of the $(n_1-k_1) \times k_2$ column parity block 1103. The row and column parity block 1104 is produced by systematically encoding each column of the row parity block 1102 with the first polar code, and writing the computed parity bits for each column into the corresponding column of the $(n_1-k_1) \times (n_2-k_2)$ row and column parity block 1104. Altogether, the data block 1101, row parity block 1102, column parity block 1103, and row and column parity block 1104 form an $n_1 \times n_2$ codeword block, which can be serialized and transmitted over the communication channel. In some embodiments, the product polar coding is scaled to higher-dimensional coupling, e.g., 3-dimensional cube-like structure from the 2-dimensional square-like structure. In some embodiments, each component polar coding in row and column has irregularly different parameters, e.g., the frozen bit locations are non-identical to improve the performance for iterative decoding.

Figure 12:
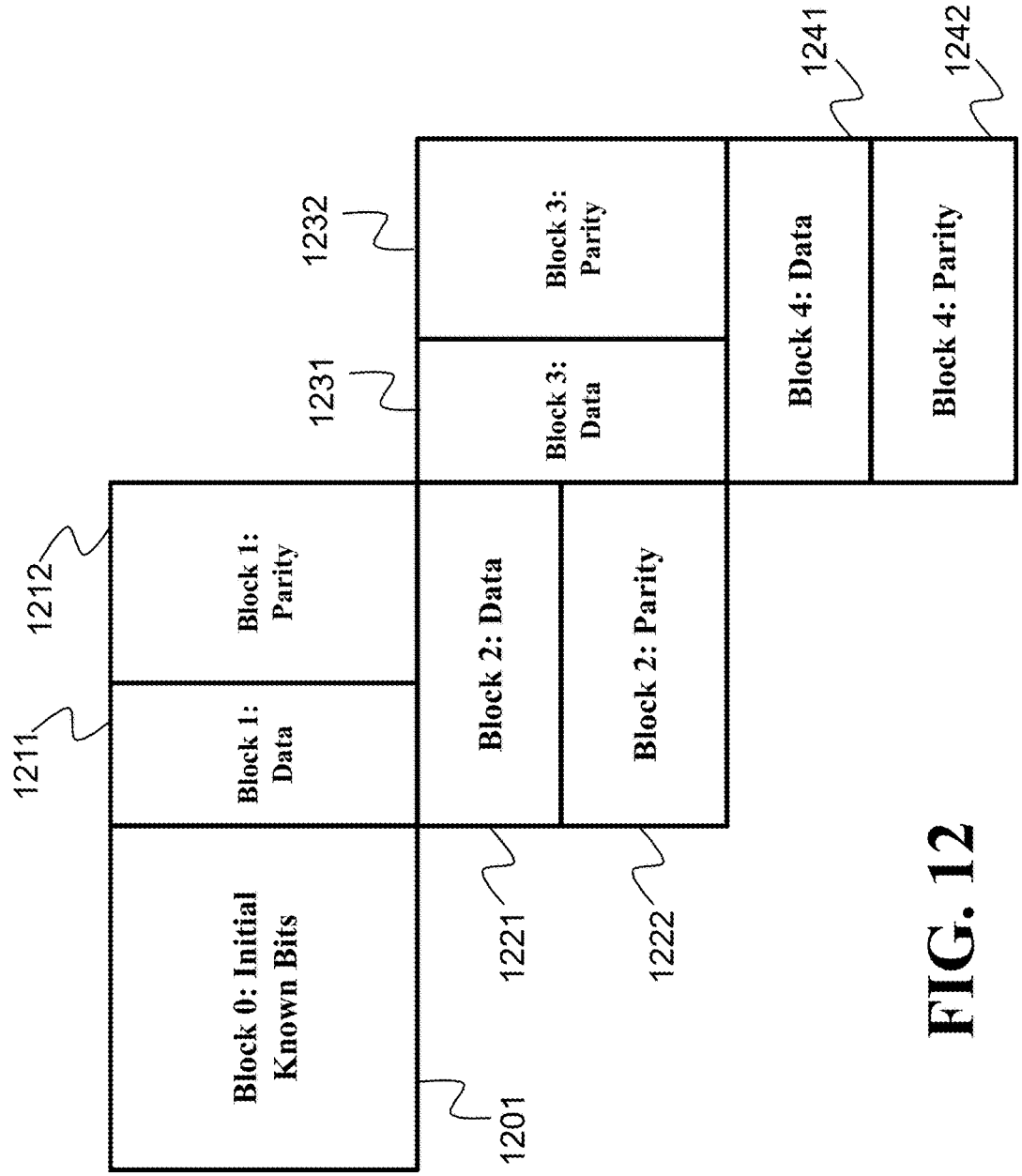
FIG. 12 is an illustration of an example concatenated error correcting code with a staircase coding structure according to some embodiments.

FIG. 12 illustrates another example of spatially coupled polar coding with a staircase coding structure. This coding scheme involves square blocks arrange in a structure that resembles a staircase. The first block in the structure 1201, numbered as "Block 0", includes a square block of bits that are set to fixed, known values. Subsequent blocks are numbered "Block 1", "Block 2", and so on, with each including a data part and a parity part. For example, "Block 1" includes the "Block 1: Data" 1211 and the "Block 1: Parity" 1212. While this figure illustrates 5 blocks, this structure is straightforward to generalize to more or fewer blocks. Each square block has dimensions of $n_1 \times n_1$. For the odd numbered subsequent blocks, the data parts (e.g., 1211, 1231) have dimensions $n_1 \times k_1$ and the parity parts (e.g., 1212, 1232) have dimensions $n_1 \times (n_1-k_1)$. For the even numbered subsequent blocks, the data parts (e.g., 1221, 1241) have dimensions $k_1 \times n_1$ and the parity parts (e.g., 1222, 1242) have dimensions $(n_1-k_1) \times n_1$. This coding structure employs a component polar code that encodes $n_1+k_1$ data bits into a codeword of length $2n_1$. For the specific example illustrated, which includes 4 subsequent blocks after the initial "Block 0", $n_1 \times k_1 \times 4$ bits of data are encoded by first writing them into the data parts of the subsequent blocks 1211, 1221, 1231, 1241. Then, the parity parts of the subsequent blocks 1212, 1222, 1232, 1242 are sequentially produced as follows:

Each row of the parity part of each odd numbered block 1212, 1232 is produced by systematically encoding the concatenation of the corresponding row of the previous block and the corresponding row of the data part of the same block. For example, row i of the parity part of "Block 1" 1212 is determined by the parity bits produced by the systematic encoding of row i of "Block 0" 1201 concatenated with row i of the data part of "Block 1" 1211. In another example, row i of the parity part of "Block 3" 1232 is determined by the parity bits produced by the systematic encoding of row i of "Block 2", which in turn includes row i of the data part of "Block 2" 1221 concatenated with row i of the parity part of "Block 2" 1222, concatenated with row i of the data part of "Block 3" 1231.

Each column of the parity part of each even numbered block 1222, 1242 is produced in a similar manner, however with the procedure operating over columns instead of the rows. For example, column i of the parity part of "Block 2" 1222 is determined by the parity bits produced by the systematic encoding of column i of "Block 1", which in turn includes column i of the data part of "Block 1" 1211 concatenated with column i of the parity part of "Block 1" 1212, concatenated with column i of the data part of "Block 2" 1221.

The overall concatenated codeword generated by the staircase encoding procedure is all of the bits in the subsequent blocks after the initial "Block 0", which does not need to be transmitted since it is set to fixed, known values. The bits in "Block 1", "Block 2", and so on are serialized for transmission over the communication channel. The benefit of the staircase polar coding structure includes reduced latency compared to single polar coding having the corresponding codeword length. The soft-decision decoding can be carried out in parallel, and a few iterations over neighboring decoders are employed in a sliding window manner for low-latency data communications in this embodiment. Other examples of spatially-coupled polar coding include braided structure, convolutional structure, tail-biting, torus tail-biting, and so on. The regular parameters of each component polar coding are individually designed in an irregular manner so that the iterative soft decoding can quickly correct the potential errors.

The regular polar coding has a limited degree of freedom to design, which determines frozen bit locations. Some embodiments increase the degrees of freedom to facilitate the soft-decision decoding by having multiple polar codes with different parameters such as code lengths, code rates, and frozen bit locations.

Figure 13:
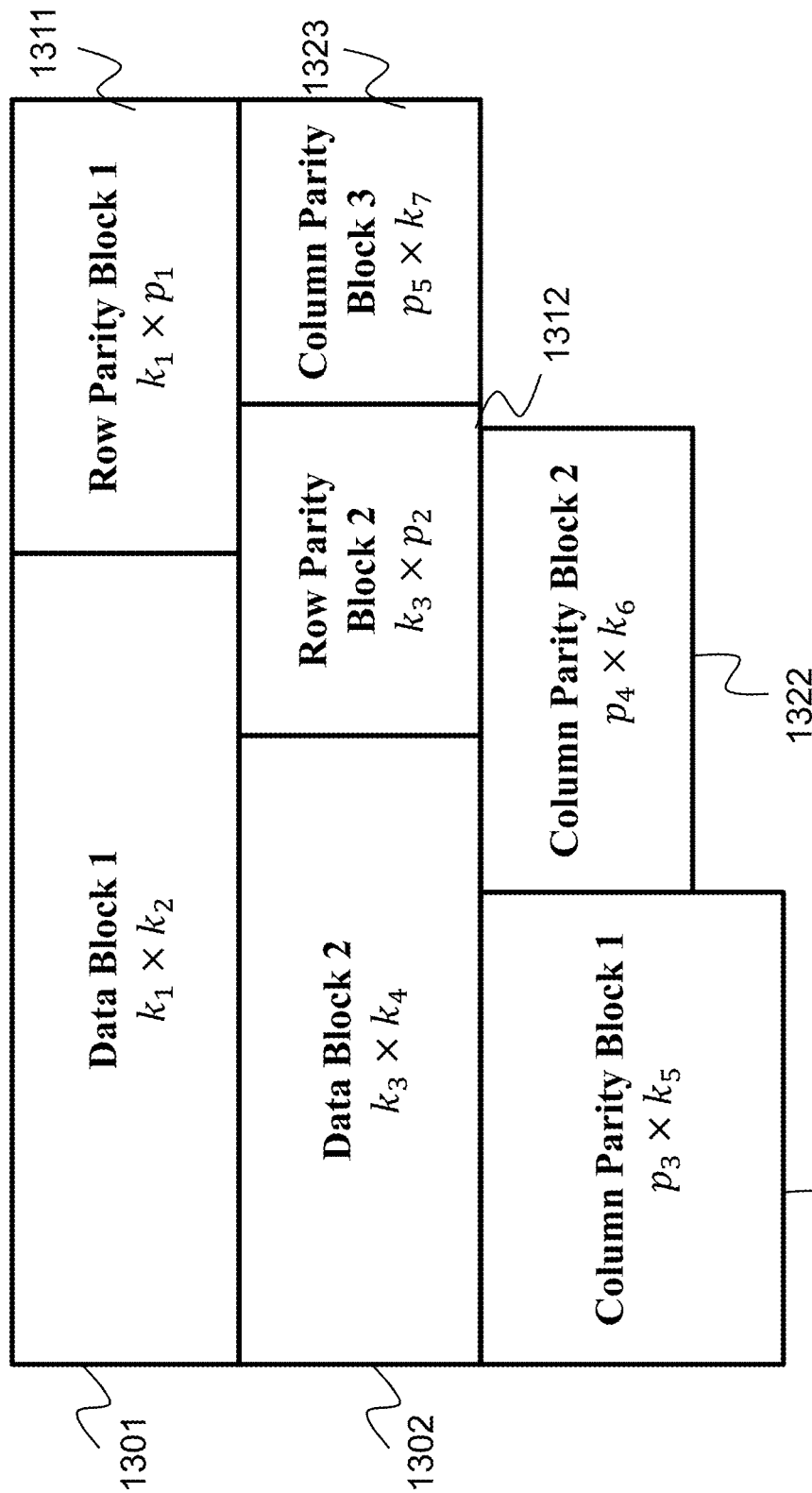
FIG. 13 is an illustration of an example concatenated error correcting code with an irregular coding structure according to some embodiments.

In particular, FIG. 13 illustrates an example concatenated polar code with an irregular coding structure. This coding scheme employs a combination of polar codes with different codeword and data lengths in an irregular structure where frozen bit locations are non-identical. The data bits of the overall concatenated code are arranged in one or more rectangular blocks, which are vertically stacked and aligned along their left edge. In our illustrated example, there are two blocks of data bits 1301 and 1302, with dimensions $k_1 \times k_2$ and $k_3 \times k_4$, respectively. Then, one or more row parity blocks are horizontally appended to right of the data blocks, with each row of the row parity blocks determined by the parity bits produced by the systematic encoding of the corresponding row of data bits that it is appended to. In our illustrated example, there are two row parity blocks 1311 and 1312. In particular, the first row parity block 1311, with dimensions $k_1 \times p_1$, is produced by systematically encoding the rows of the first data block 1301 with a component polar code that encodes $k_1$ data bits into a codeword of length $(k_2+p_1)$. The second row parity block 1312, with dimensions $k_2 \times p_2$, is similarly produced by systematically encoding the rows of the second data block 1301, although now using a component polar code that encodes $k_2$ data bits into a codeword of length $(k_4+p_2)$. Next, column parity blocks are vertically appended to the bottom of the data bit blocks and row parity blocks, with each column of the column parity blocks determined by the parity bits produced by the systematic encoding of the corresponding column of data and parity bits to which it is appended. In our illustrated example, there are three row parity blocks 1321, 1322, and 1323. In particular, the first column parity block 1321, with dimensions $p_3 \times k_5$, is produced by systematically encoding the first $k_5$ columns of both data blocks 1301 and 1302 using a component polar code that encodes $(k_1+k_3)$ data bits into a codeword of length $(k_1+k_3+p_3)$. The second column parity block 1322, with dimensions $p_4 \times k_6$, is produced using a component polar code that encodes $(k_1+k_3)$ data bits into a codeword of length $(k_1+k_3+p_4)$. Note that different columns of the second column parity block 1322 overlap different parts of the two data blocks 1301 and 1302, and the two row parity blocks 1311 and 1312. Each column of the second column parity block 1322 is produced by systematically encoding the columns directly above it.

FIG. 13 illustrates only one particular example arrangement, but this general concept includes many possible irregular arrangement of data blocks, row parity blocks, and column parity blocks that employ a variety of component polar codes. For example, protograph-based polar coding structure is constructed, where parallel polar codes are mixtured at each polarizers by shift operations. Another example uses ever increasing staircase structure to provide rateless capability, where only parity bits are continuously generated by component polar codes until the receiver acknowledges the decoding completion. Therefore, the irregular coding structure and application of various component polar codes with different coding parameters produces varying degrees of freedom (and hence varying degrees of error correction performance) across the overall codeword of the concatenated code, which is potentially useful for non-uniform communication channels. This overall codeword is serialized for transmission over the communications channel, and this serialization may be permuted via an interleaver before transmission over a non-uniform channel to potentially obtain error correcting performance gains.

Figure 14:
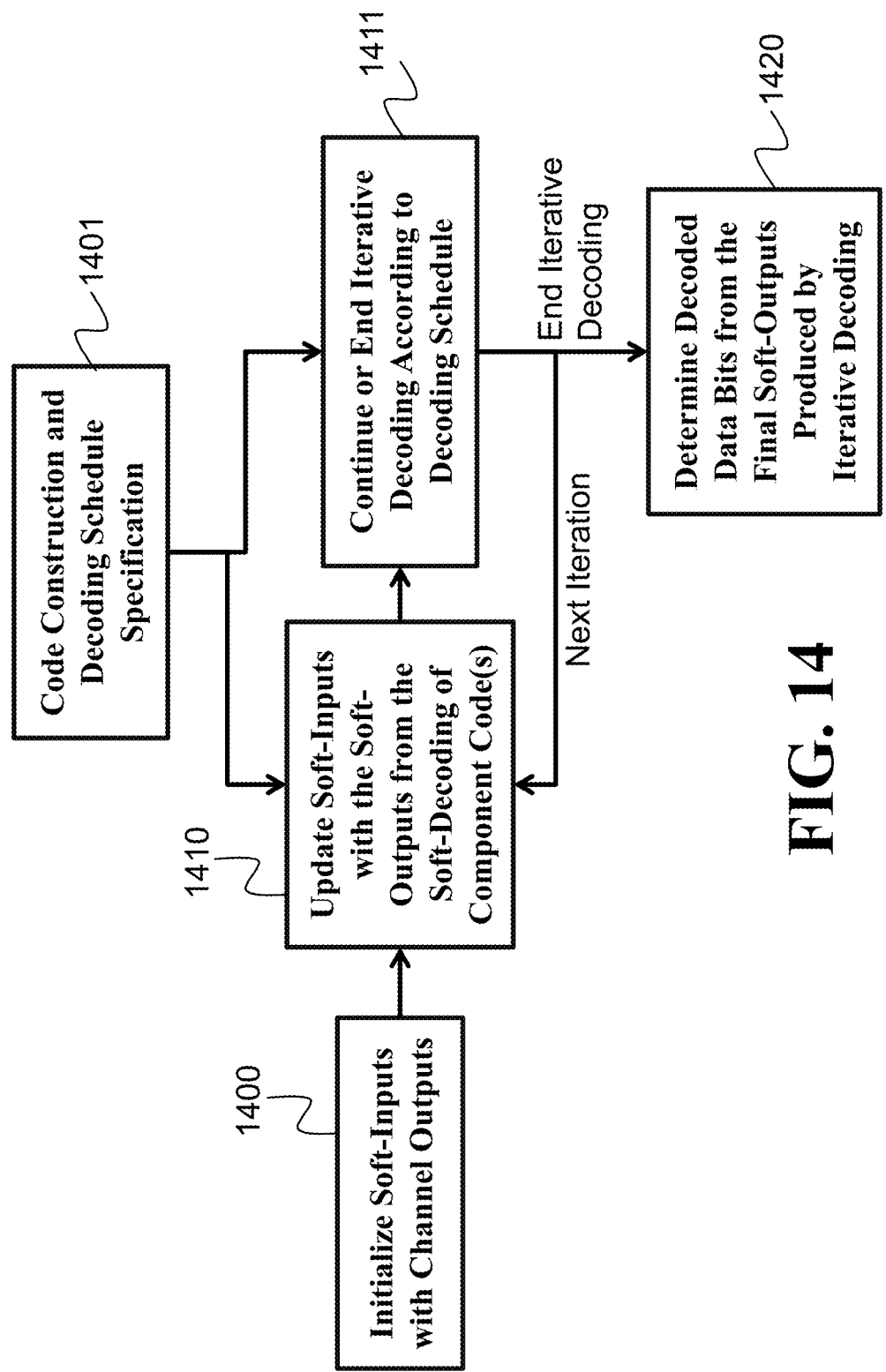
FIG. 14 is a block diagram of the iterative decoding procedure of concatenated error correcting codes using a soft-decoder according to some embodiments.

FIG. 14 is a block diagram of the iterative decoding procedure of concatenated polar codes using soft-decision decoders applied to various component codes. The first step is to initialize the soft-inputs for the soft-decision decoder 1400 with the channel output, that is, the noisy codeword received via the communication channels. Then, the specification of the concatenated polar code construction and the decoding schedule 1401 specifies the structure of the concatenated error correcting code and which component code(s) are soft-decoded 1410 in each decoding iteration. The soft-decoding of one or more component code(s) 1410 produces soft-outputs which are used to update the soft-inputs for the next iteration, as specified by the decoding schedule 1401. Next, a decision is made whether to proceed to the next iteration or to exit the iterative decoding procedure 1411, as specified by the decoding schedule 1401. This decoding order schedule includes, e.g., sliding window for low-latency decoding, and flooding scheduling for high parallelism. If continuing decoding iterations, the procedure returns to the soft-decision decoding 1410 of one or more component code(s), which are selected as specified in the decoding schedule 1401. This process iterates until the decoding schedule 1401 indicates that it should stop, resulting in the final soft-outputs produced by the iterative decoding, from which the decoded bits are determined 1420.

For example, with a product code, as illustrated in FIG. 11, an example decoding schedule would be to alternate between soft-decoding the row component codes and the column component codes until a fixed number of iterations have elapsed. In yet another embodiment, each component polar code has additional irregularity to facilitate soft-decision decoding.

Figure 15A:
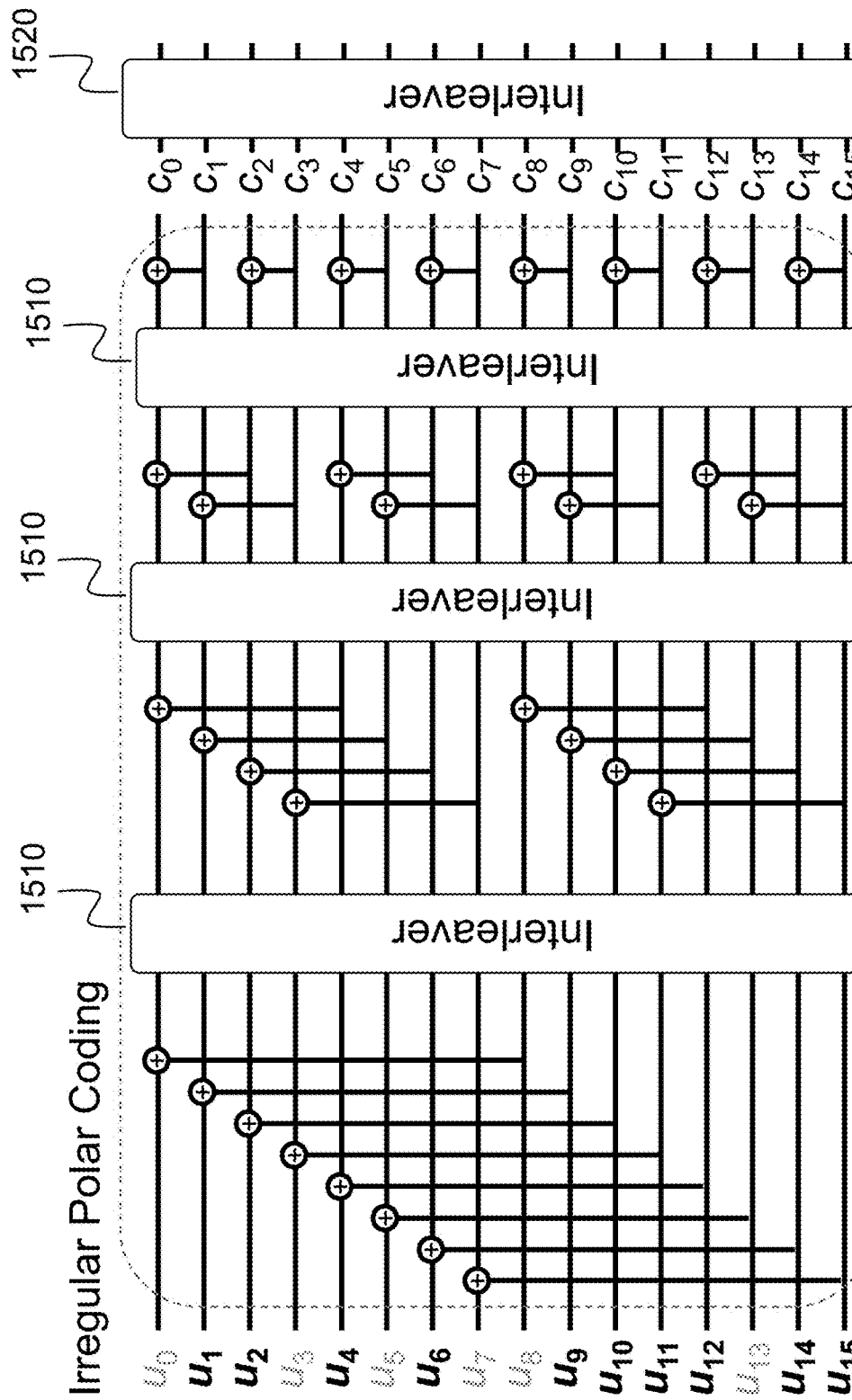
FIG. 15A is an illustration of an example irregular polar coding structure using multiple interleaving units between polarization stages according to some embodiments.

FIG. 15A shows an example of irregular polar code, having interleavers 1510 between several, e.g., each, polarization stages. Along and/or in addition to the modulation mapping interleaver 1520, this embodiment employs more interleaving units 1510 to improve the decoding performance, by carefully designing the intermediate interleavers, without additional penalty of computational complexity.

Figure 15B:
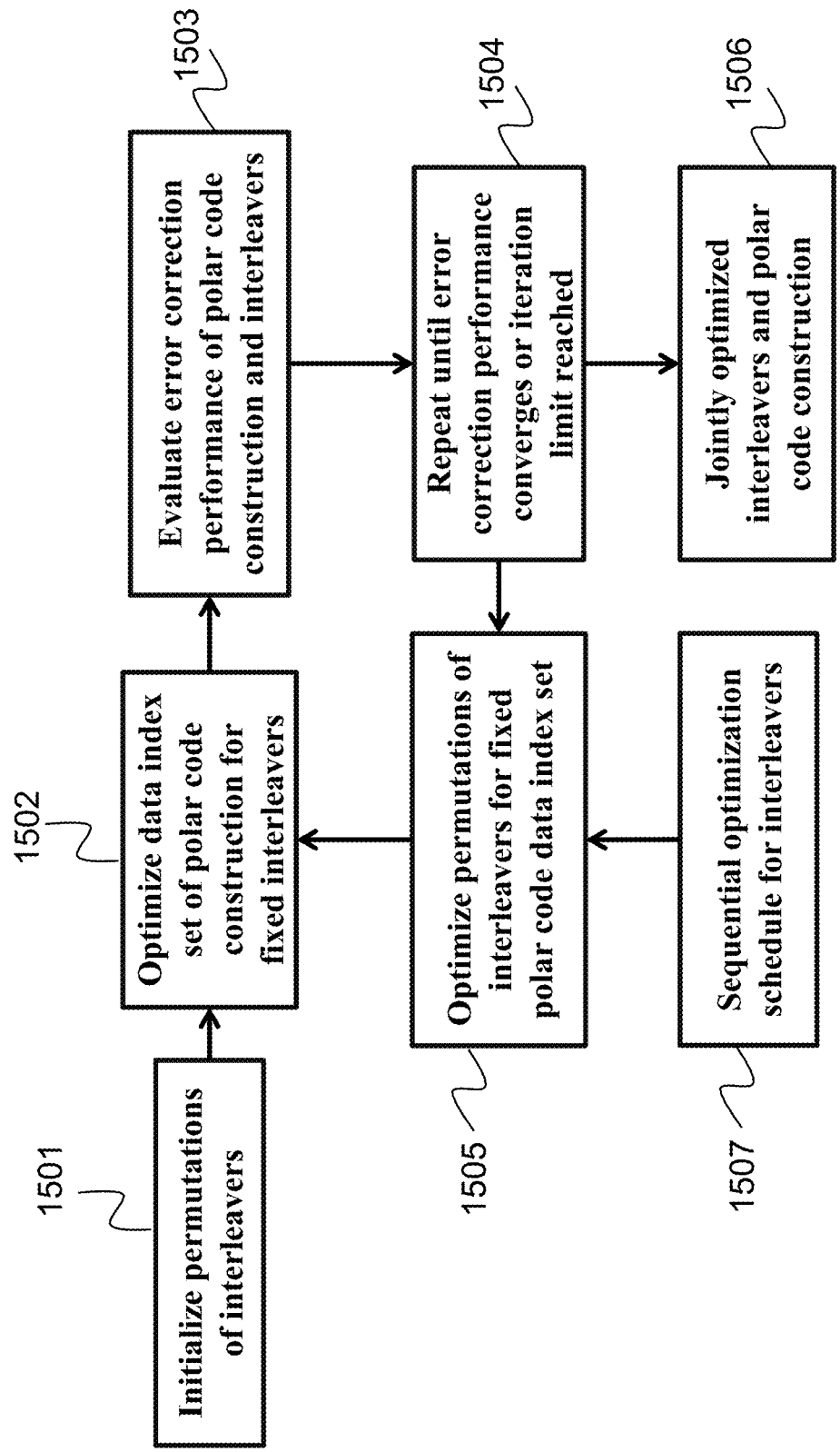
FIG. 15B is a block diagram of a method for designing the intermediate interleavers according to some embodiments.

FIG. 15B shows a block diagram of a method for designing the intermediate interleavers, while managing the computational complexity. This procedure is similar to and uses several of the same subcomponents of the procedure for jointly optimizing the interleaver and polar code construction for non-uniform channels as illustrated in FIG. 10B. First, the interleavers are set to some initial permutations 1501. Then, the polar code construction is optimized for these initial permutations of interleaver 1502, by selecting the data index set corresponding to the most-reliable pseudo-channels. Then, the error correction performance of polar code construction and interleavers is evaluated 1503. Next, a decision to continue or end the iterative optimization procedure is made 1504, based on whether the error correction performance has converged (i.e., not changing significantly with respect to previous iterations) or if a limit on the total number of iterations has been reached. If continuing, the interleaver permutations are optimized while the polar code data set index is kept fixed 1505, then the polar code data set index is again optimized while the interleaver is kept fixed 1502, then the performance of the polar code construction and interleavers is reevaluated 1503, and a decision to continue or end the iterative optimization is again made 1504. After ending these iterations, the final result is the jointly optimized interleavers and polar code construction 1506.

Notable difference between this procedure and that illustrated by FIG. 10B is that the optimization of the interleavers 1505 handle optimizing multiple permutations rather than just one. As done in the procedure of FIG. 10B, these interleaver permutations can be parameterized to make the individual optimization of each interleaver tractable. However, a brute-force search over all combinations of the multiple interleavers can drastically raise the computation complexity. To manage the computational costs, the interleavers are instead optimized sequentially, that is, individually optimizing one of the interleavers at a time while keeping the others fixed according to an optimization schedule 1507. The optimization schedule 1507 can, for example, specify that all of the interleavers are sequentially optimized in during one execution of interleavers optimization 1505, or, as another example, that only a subset of the interleavers are sequentially optimization during one execution of the interleavers optimization 1505 while rotating this selected subset across the multiple executions of the interleavers optimization 1505 in the overall iterative code construction procedure.

Figure 16A:
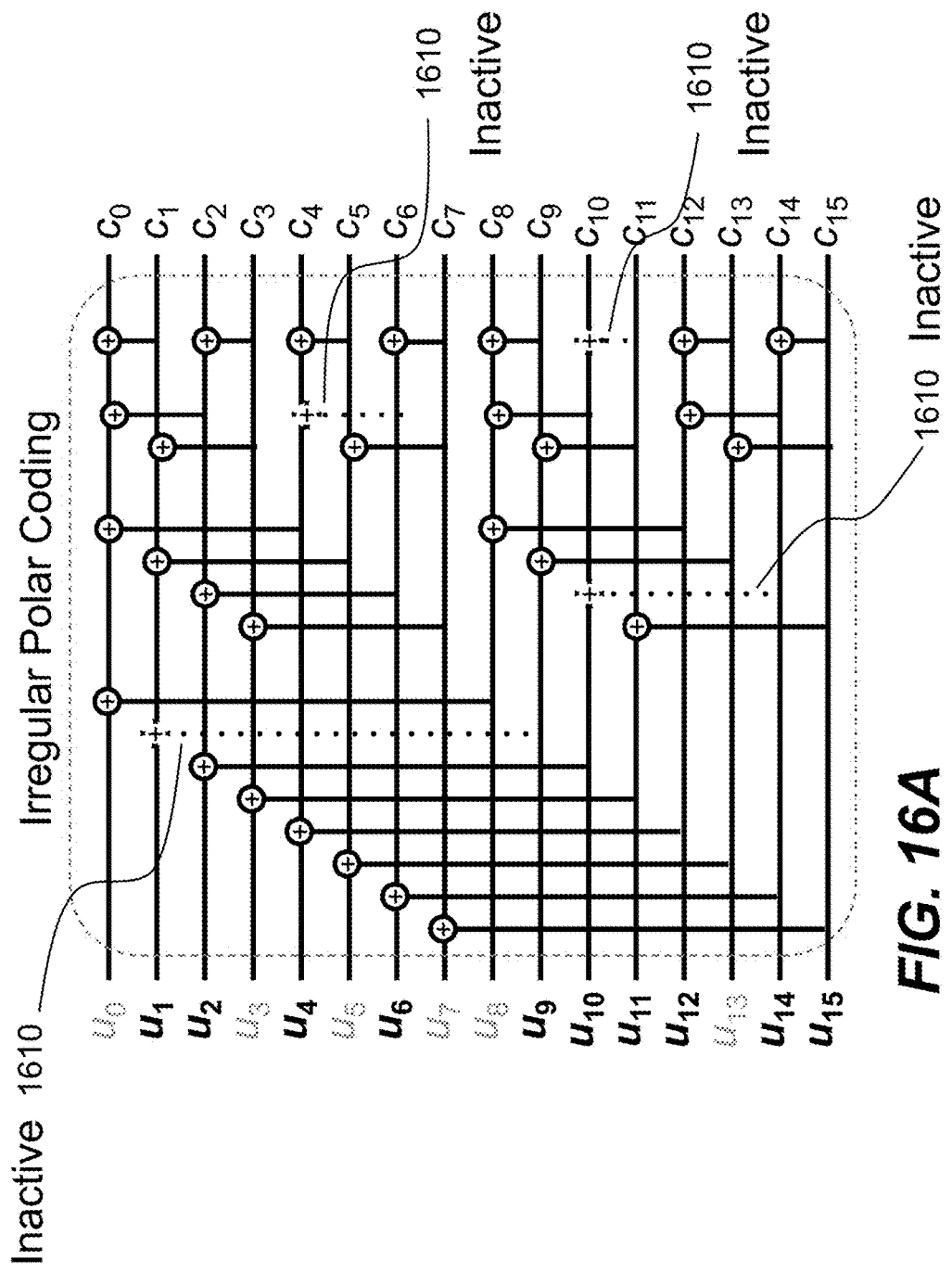
FIG. 16A is an illustration of an example irregular polar coding structure having sparsely chosen inactive polarization unit according to some embodiments.

FIG. 16A illustrates another example of irregular polar coding structure, where several XOR polarization units are de-activated. By carefully selecting inactive polarizers, the error correction performance can be improved and the computational complexity for encoding and decoding can be reduced. The location of inactive polarizers is determined by analyzing the error bound with EXIT methods so that the error bound is minimized in a greedy fashion. Because most polarizers do not drastically degrade the decoding performance, this irregular de-activation can significantly reduce the decoding complexity by choosing more inactive polarizers.

Figure 16B:
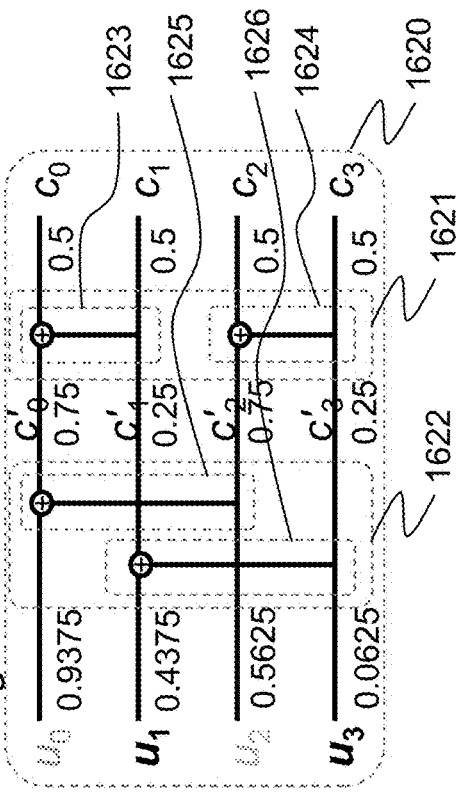
FIG. 16B is an illustration of three example irregular polar coding structures having inactive polarization unit for a code length of 4, showing impact of de-activated polarizer in upper bound of error probability according to some embodiments.
Figure 16B:
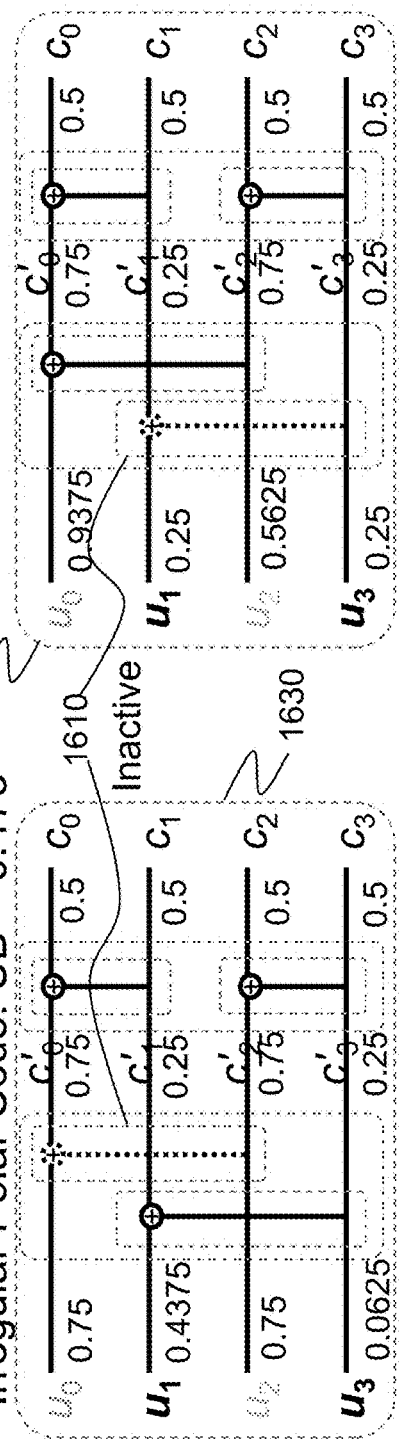

FIG. 16B shows three examples of irregular polar coding structure for a code length of 4 to illustrate the benefits provided by de-activating polarizers. The regular polar coding 1620 has two polarization stages 1621, 1622, where each stage has two polarizer units 1623, 1624 and 1625, 1626. Each polarizer unit provides worse sub-channel and better sub-channel. For example, when the encoded four bits $\{c_0, c_1, c_2, c_3\}$ have uniform reliability with a Bhattacharyya parameter of 0.5, the first polarizer 1623 in the first polarization stage 1621 provides worse bit $c'_0$ having Bhattacharyya parameter of 0.75 and better bit $c'_1$ having Bhattacharyya parameter of 0.25. Similarly, the second polarizer 1623 in the first polarization stage 1621 provides worse bit $c'_2$ having Bhattacharyya parameter of 0.75 and better bit $c'_3$ having Bhattacharyya parameter of 0.25. The first polarizer 1625 in the second polarization stage 1622 provides worse bit $u_0$ having Bhattacharyya parameter of 0.9375 and better bit $u_2$ having Bhattacharyya parameter of 0.5625.

The second polarizer 1626 in the second polarization stage 1622 provides worse bit $u_1$ having Bhattacharyya parameter of 0.4375 and better bit $u_3$ having Bhattacharyya parameter of 0.0625. For the code rate of 0.5, two best bits $\{u_1, u_3\}$ having lower Bhattacharyya parameters are selected as information data, while the remaining two worse bits $\{u_0, u_2\}$ having higher Bhattacharyya parameters are selected as frozen bits. This regular polar coding is expected to offer an error rate performance no better than an upper bound (UB) of $1-(1-0.4375)(1-0.0625)=0.473$.

One example of irregular polar coding 1630 de-activates 1610 the third polarizer unit 1625. This inactive polarizer does not change the reliability of intermediate bits $\{c'_0, c'_2\}$ for the bits $\{u_0, u_2\}$, and thus those Bhattacharyya parameters are both 0.75. However, those bits are already unreliable to be frozen bits. Therefore, the error rate performance is not affected by de-activating the polarizer unit 1630 because information bits $\{u_1, u_3\}$ have the same reliability as the regular polar coding 1620. This example suggests that the embodiments employing this principle can reduce the computational complexity by de-activating non-important polarizer units without causing any performance penalty.

Another example of irregular polar coding 1640 shows more important benefit, i.e., error rate performance can be improved by reducing the complexity. This irregular polar coding 1640 de-activates 1610 the fourth polarizer unit 1626. Therefore, the reliability of bits $\{u_1, u_3\}$ remains the same of intermediate bits $\{c'_1, c'_3\}$ having Bhattacharyya parameter of 0.25. The resulting UB is $1-(1-0.25)(1-0.25)=0.4375$, which is better than the regular polar coding 1620. This example suggests that de-activating polarizer units can not only reduce the computational complexity but also improve the error rate performance, by flattening the reliability of information bits.

The irregular polar coding with inactive polarizer units can have more degrees of freedom to design than regular polar coding; specifically, there are $2^{n \log_2(n)/2}$ possibilities to select the locations of inactive polarizer units because there are $N'=n \log_2(n)/2$ polarizer units. Let D be an activation matrix of size $n/2$-by-$\log_2(n)$, whose (i,j)-th entry is either '1' or '0' representing whether the i-th polarizer unit at the j-th polarization stage is active or inactive. For example, the regular polar coding 1620 has all-ones activation matrix of $$D = \begin{bmatrix} 1 & 1 \\ 1 & 1 \end{bmatrix},$$

the irregular polar coding 1630 has $$D = \begin{bmatrix} 1 & 0 \\ 1 & 1 \end{bmatrix},$$

and the irregular polar coding 1640 has $$D = \begin{bmatrix} 1 & 1 \\ 1 & 0 \end{bmatrix}.$$

Because the total number of possible irregular polar codes is exponentially increasing, it is not straightforward to optimize the activation matrix for long irregular polar coding. In order to design the activation matrix to achieve good irregular polar coding, a greedy list search is used in the invention.

Figure 16C:
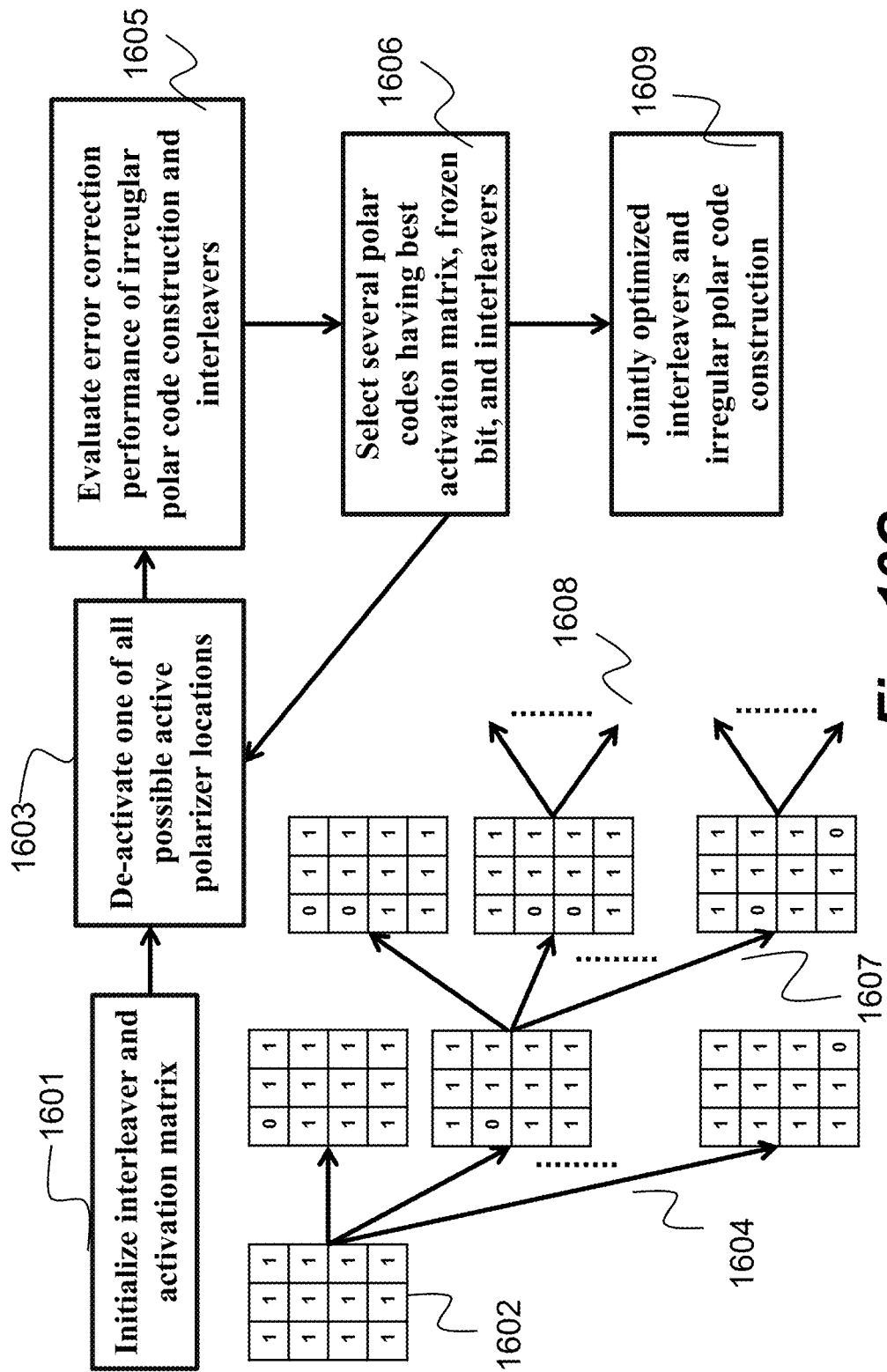
FIG. 16C is a block diagram of a method for selective inactive polarizers of the irregular polar coding structure based on a tolerance of the decoding performance according to some embodiments.

FIG. 16C shows a block diagram of a method for selecting inactive polarizers of the irregular polar coding structure according to some embodiments. The method initializes 1601 the activation matrix to be all-ones 1602, as the regular polar coding. Next, the method de-activates 1603 the previous activation matrix, i.e., changing an element of '1' to '0'. The de-activation is considered for all possible N' locations 1604. Then, the error rate probability is computed for each irregular polar coding. Here, the interleaver and frozen bit locations are optimized similarly as described above, during the analysis of the UB of error rate performance. The method selects 1606 the best L' irregular polar coding having the smallest error probability. For each selected irregular polar coding, the method further de-activates 1603 different polarizer units 1607. The procedure continues 1608 until a termination condition is met. The termination condition includes, e.g., the case when the error rate performance is minimized or the case when the error rate performance becomes worse than that of the regular polar coding to minimize the computational complexity. After the list search is finished, the irregular polar coding with optimized activation table, interleaver and frozen bit locations is produced 1609.

Note that systematic coding is possible without any modifications for those irregular polar codes by using two-times irregular polar encoding as done for regular systematic polar encoders. This procedure results in the systematic coding, where the source data symbols appear in the same location at the encoded data symbols even for sparsified irregular polar coding.

The de-activating XOR of polarizer unit is equivalent to change the polar kernel of $$F = \begin{bmatrix} 1 & 0 \\ 1 & 1 \end{bmatrix}$$

to another full-rank identity kernel of $$\begin{bmatrix} 1 & 0 \\ 0 & 1 \end{bmatrix}$$

at the inactive location. Based on this recognition, the irregular polar coding based on sparsified inactive polarizer units is further generalized to non-binary and high-order kernels. For example, some embodiments use irregular polar coding with different full-rank non-binary kernels such as $$\begin{bmatrix} 1 & 0 \\ 2 & 3 \end{bmatrix}, \begin{bmatrix} 1 & 0 \\ 0 & 2 \end{bmatrix}, \begin{bmatrix} 2 & 0 \\ 1 & 1 \end{bmatrix}$$

for 4-ary Galois filed (i.e., module-4 arithmetic). Those different non-binary kernels are sparsely assigned for each polarizer units to improve the error rate performance and to reduce the computational complexity.

Yet another embodiment uses high-order kernels; e.g., $$\begin{bmatrix} 1 & 0 & 0 \\ 0 & 1 & 0 \\ 1 & 1 & 1 \end{bmatrix}, \begin{bmatrix} 1 & 0 & 0 \\ 1 & 1 & 0 \\ 1 & 1 & 1 \end{bmatrix}, \begin{bmatrix} 1 & 0 & 0 \\ 0 & 1 & 0 \\ 0 & 0 & 1 \end{bmatrix}, \begin{bmatrix} 1 & 0 & 0 \\ 0 & 1 & 0 \\ 0 & 1 & 1 \end{bmatrix},$$

for order-3 kernels, and $$\begin{bmatrix} 1 & 0 & 0 & 0 \\ 1 & 1 & 0 & 0 \\ 1 & 0 & 1 & 0 \\ 1 & 0 & 0 & 1 \end{bmatrix}, \begin{bmatrix} 1 & 0 & 0 & 0 \\ 0 & 1 & 0 & 0 \\ 1 & 1 & 1 & 0 \\ 1 & 0 & 0 & 1 \end{bmatrix}, \begin{bmatrix} 1 & 0 & 0 & 0 \\ 0 & 1 & 0 & 0 \\ 0 & 0 & 1 & 0 \\ 0 & 0 & 0 & 1 \end{bmatrix}, \begin{bmatrix} 1 & 0 & 0 & 0 \\ 1 & 1 & 0 & 0 \\ 0 & 1 & 1 & 0 \\ 0 & 0 & 1 & 1 \end{bmatrix},$$

for order-4 kernels, in an irregular fashion. High-order and non-binary kernels can be combined as well.

Figure 17:
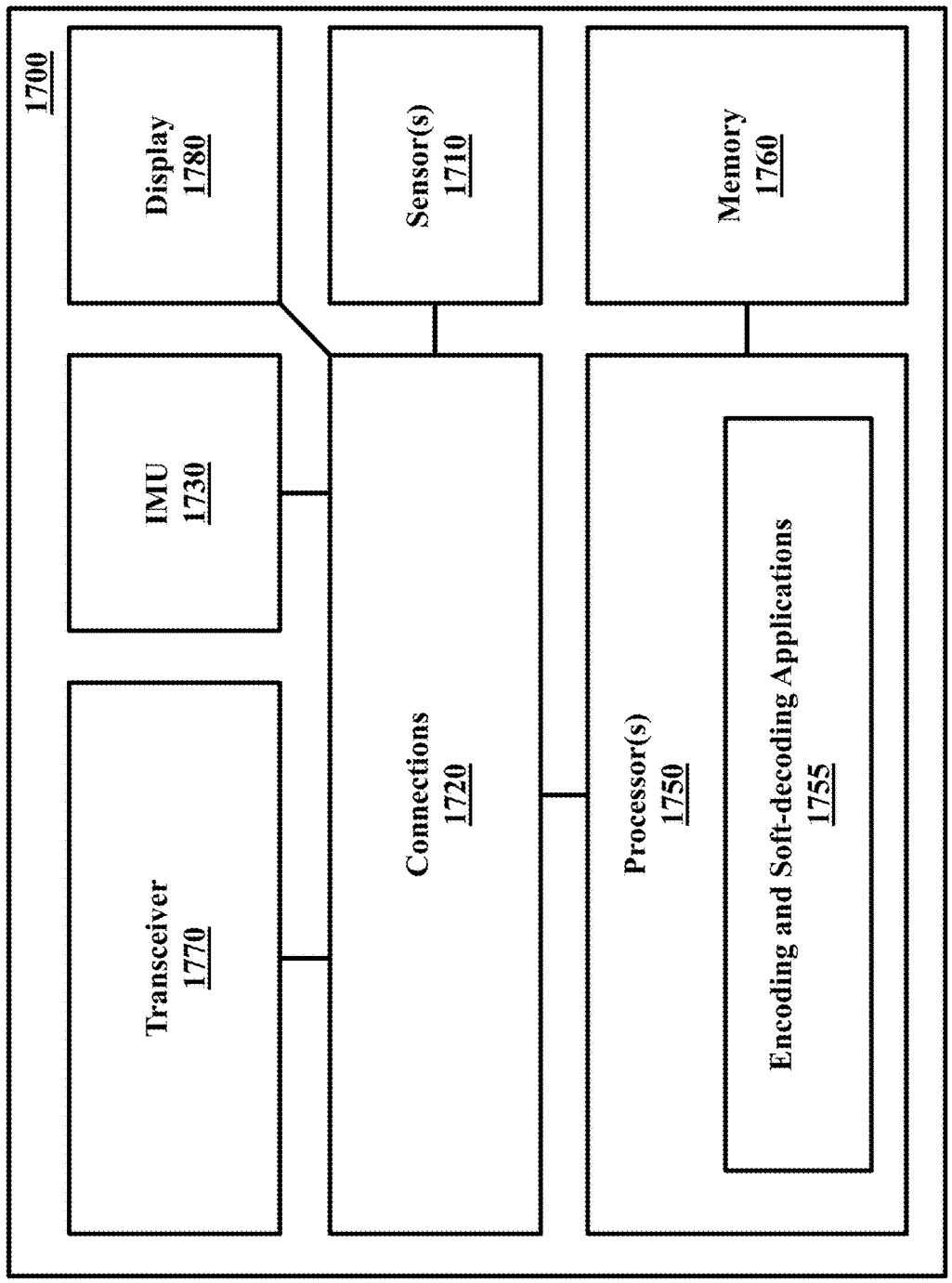
FIG. 17 is a block diagram of a system suitable for implementing different components of the receiver for performing the soft decoding according to some embodiments and/or the transmitter for encoding the codeword according to some embodiments.

FIG. 17 shows a block diagram of a system suitable for implementing different components of the receiver for performing the soft decoding according to some embodiments and/or the transmitter for encoding the codeword according to some embodiments. The system 1700 can include one or combination of a sensor 1710, an inertial measurement unit (IMU) 1730, a processor 1750, a memory 1760, a transceiver 1770, and a display/screen 1780, which can be operatively coupled to other components through connections 1720. The connections 1720 can comprise buses, lines, fibers, links or combination thereof.

The transceiver 1770 can, for example, include a transmitter enabled to transmit one or more signals over one or more types of wireless communication networks and a receiver to receive one or more signals transmitted over the one or more types of wireless communication networks. The transceiver 1770 can permit communications with wireless networks based on a variety of technologies such as, but not limited to, femtocells, Wi-Fi networks or wireless local area networks (WLANs), which may be based on the IEEE 802.11 family of standards, wireless personal area networks (WPANS) such Bluetooth, near field communication (NFC), networks based on the IEEE 802.15x family of standards, and/or wireless wide area networks (WWANs) such as LTE, WiMAX, etc. The system 400 can also include one or more ports for communicating over wired networks.

In some embodiments, the processor 1750 can also receive input from IMU 1730. In other embodiments, the IMU 1730 can comprise 3-axis accelerometer(s), 3-axis gyroscope(s), and/or magnetometer(s). The IMU 1730 can provide velocity, orientation, and/or other position related information to the processor 1750. In some embodiments, the IMU 1730 can output measured information in synchronization with the capture of each image frame by the sensor 1710. In some embodiments, the output of the IMU 1730 is used in part by the processor 1750 to fuse the sensor measurements and/or to further process the fused measurements.

The system 1700 can also include a screen or display 1780 rendering images, such as color and/or depth images. In some embodiments, the display 1780 can be used to display live images captured by the sensor 1710, fused images, augmented reality (AR) images, graphical user interfaces (GUIs), and other program outputs. In some embodiments, the display 1780 can include and/or be housed with a touchscreen to permit users to input data via some combination of virtual keyboards, icons, menus, or other GUIs, user gestures and/or input devices such as styli and other writing implements. In some embodiments, the display 1780 can be implemented using a liquid crystal display (LCD)

display or a light emitting diode (LED) display, such as an organic LED (OLED) display. In other embodiments, the display 1780 can be a wearable display.

Exemplary system 1700 can also be modified in various ways in a manner consistent with the disclosure, such as, by adding, combining, or omitting one or more of the functional blocks shown. For example, in some configurations, the system 1700 does not include the IMU 1730 or the sensors 1770. In some embodiments, portions of the system 1700 take the form of one or more chipsets, and/or the like.

The processor 1750 can be implemented using a combination of hardware, firmware, and software. The processor 1750 can represent one or more circuits configurable to perform at least a portion of a computing procedure or process related to sensor fusion and/or methods for further processing the fused measurements. The processor 1750 retrieves instructions and/or data from memory 1760. The processor 1750 can be implemented using one or more application specific integrated circuits (ASICs), central and/or graphical processing units (CPUs and/or GPUs), digital signal processors (DSPs), digital signal processing devices (DSPDs), programmable logic devices (PLDs), field programmable gate arrays (FPGAs), controllers, micro-controllers, microprocessors, embedded processor cores, electronic devices, other electronic units designed to perform the functions described herein, or a combination thereof.

The memory 1760 can be implemented within the processor 1750 and/or external to the processor 1750. As used herein the term "memory" refers to any type of long term, short term, volatile, nonvolatile, or other memory and is not to be limited to any particular type of memory or number of memories, or type of physical media upon which memory is stored. In some embodiments, the memory 1760 holds program codes that facilitate the soft decoding and polar encoding.

In some embodiments, additionally or alternatively to the soft decoding, the processor 1750 can perform one or combination of the soft-decoding applications 1755. For example, the soft output of the decoding can be used for decoding concatenated ECCs, which are formed from multiple component ECCs that are combined into a higher performance code. Another example is a system employing iterative equalization and decoding, where soft-decision output from decoder is fed back to demodulator to refine the decoder input iteratively. Yet another example is acting on the decoded output, e.g., showing the output on the display 1780, storing the output in the memory 1760, transmitting the output using the transceiver 1770, and/or performing the actions based on the output and measurements of the sensor 1710.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A receiver including a polar decoder for decoding an encoded codeword transmitted over a communication channel, comprising:
   a front end to receive over a communication channel a codeword including a sequence of bits modified with noise of the communication channel, wherein the codeword is encoded by at least one polar encoder with a polar code; and
   a soft decoder operated by a processor to produce a soft output of the decoding, wherein the processor is configured to
      estimate possible values of the bits of the received codeword using a successive cancelation list (SCL) decoding to produce a set of candidate codewords;
      determine a distance between each candidate codeword and a soft input to the soft decoder; and
      determine a likelihood of a value of a bit in the sequence of bits using a difference of distances of the candidate codewords closest to the received codeword and having opposite values at the position of the bit.

2. The receiver of claim 1, wherein the encoded codeword is encoded using an encoding matrix formed as a Kronecker power of a lower-triangular matrix of ones, wherein the system further comprises:
   a memory to store the encoding matrix, and wherein the soft decoder retrieves the encoding matrix from the memory and uses the encoding matrix to decode the codeword.

3. The receiver of claim 1, wherein the encoded codeword is encoded using an encoding matrix formed as a Kronecker power of a lower-triangular matrix of ones, with irregular selection of de-activated exclusive-or operations and intermediate interleaving between the Kronecker powers, wherein the system further comprises:
   a memory to store the encoding matrix, and wherein the soft decoder retrieves the encoding matrix from the memory and uses the encoding matrix to decode the codeword.

4. The receiver of claim 1, wherein the SCL decodes sequentially bits of codeword, while preserving a list of possible combinations of the decoded bits, wherein for each iteration of the SCL, a number of preserved combinations is no more than a threshold, such that the size of the set of candidate codewords is no more than the threshold.

5. The receiver of claim 1, wherein the receiver receives a modulated signal from the communication channel, wherein the modulated signal is a noisy analog signal, further comprising:
a demodulator to convert the modulated signal into the soft input to the soft decoder representing the received codeword; and
a hard decoder to produce values indicative of log-likelihood ratio of the bits the received codeword based on the soft output received from the soft decoder.

6. The receiver of claim 1, wherein the soft decoder determines the distance for each candidate codeword as a Euclidean distance between the soft input and the candidate codeword.

7. The receiver of claim 1, wherein the determining the likelihood comprises
calculating a value of the soft output at each bit position of the soft input based on the difference of the distance of the closest candidate with a "1" value at that position and the distance of the closest candidate with a "0" at that position, when at least some values on the bit position at all candidate codewords have different values; and otherwise
selecting the value of the soft output as a predetermined constant when all values on the bit position at all candidate codewords have the same value.

8. The receiver of claim 7, wherein the calculating further comprises
multiplying the values of the soft output with a scaling parameter to produce the soft output for the corresponding bit of the codeword.

9. The receiver of claim 1, wherein the codeword includes a plurality of components encoded with a plurality of polar codes spatially coupled each other according to a spatial pattern defining non-identical set of parameters of each polar code including one or combination of a location of frozen bits, a number of data bits, a number of parity bits, and an interleaver permutation of the encoded bits,
wherein the soft decoder produces the soft output according to the spatial pattern by iterating the soft decoding over the plurality of components, such that the soft output of the decoding of one component is the soft input to the decoding of another component.

10. The receiver of claim 1, wherein the codeword is encoded with one or combination of a plurality of different interleavers used at intermediate encoding process, and with active and inactive exclusive-or operators adjusting a computational complexity and error correction performance of the soft decoding.

11. The receiver of claim 1, wherein the soft decoder uses an adaptive look-up-table (LUT) for determining the likelihood of the values of the bits at each polarization operation, wherein the LUT specifies downgrading and upgrading branches of polarization for each bit, and wherein the LUT rule is determined so that the output quantized message has the maximum mutual information given the input quantized messages based on probability mass function of those messages.

12. The receiver of claim 1, wherein the received codeword includes a plurality of cyclic redundancy check (CRC) codes, wherein the processor prunes the set of candidate codewords at a partial length governed by a place of inclusion of a CRC code in the received codeword when a part of a candidate codeword includes an incorrect CRC code.

13. The receiver of claim 11, wherein the soft decoder is configured for extracting a CRC value from a partially decoded candidate codeword to produce a first CRC;
calculating a CRC by applying a CRC function to the partially decoded candidate codeword to produce a second CRC;
comparing the first CRC with the second CRC; and
removing the partially decoded candidate codeword from a list of possible combinations of the decoded bits if the first CRC does not match the second CRC.

14. A method for decoding an encoded codeword transmitted over a communication channel, comprising:
receiving over a communication channel a codeword including a sequence of bits modified with noise of the communication channel, wherein the codeword is encoded with at least one polar encoder;
estimating possible values of the bits of a soft input represented by the received codeword using a successive cancelation list (SCL) decoding to produce a set of candidate codewords;
determining a distance between each candidate codeword and the received codeword; and
determining a likelihood of a value of a bit in the sequence of bits using a difference of distances of the candidate codewords closest to the received codeword and having opposite values at the position of the bit, wherein at least some steps of the method are performed using a processor.

15. The method of claim 14, wherein the SCL decodes sequentially bits of codeword, while preserving a list of possible combinations of the decoded bits, wherein for each iteration of the SCL, a number of preserved combinations is no more than a threshold, such that the size of the set of candidate codewords is no more than the threshold.

16. The method of claim 14, further comprising:
receiving a modulated signal from the communication channel, wherein the modulated signal is a noisy analog signal;
converting the modulated signal into the soft input; and
determining the distance for each candidate codeword as a Euclidean distance between the soft input and the corresponding candidate codeword.

17. The method of claim 14, wherein the determining the likelihood comprises
calculating a soft output at each bit position of the soft input based on the difference of the distance of the closest candidate with a "1" value at that position and the distance of the closest candidate with a "0" at that position, when at least some values on the bit position at all candidate codewords have different values; and otherwise
selecting the value of the soft output as a predetermined constant when all values on the bit position at all candidate codewords have the same value.

18. The method of claim 14, wherein the received codeword includes a plurality of a cyclic redundancy check (CRC) codes, wherein the processor prunes the set of candidate codewords at a partial length governed by a place of inclusion of a CRC code in the received codeword when a part of a candidate codeword includes an incorrect CRC code.

19. A non-transitory computer readable storage medium embodied thereon a program executable by a processor for performing a method, the method comprising:
receiving over a communication channel a codeword including a sequence of bits modified with noise of the communication channel, wherein the codeword is encoded with a polar encoder;

estimating possible values of the bits of a soft input represented by the received codeword using a successive cancelation list (SCL) decoding to produce a set of candidate codewords;

determining a distance between each candidate codeword and the received codeword; and determining a likelihood of a value of a bit in the sequence of bits using a difference of distances of the candidate codewords closest to the received codeword and having opposite values at the position of the bit.

20. The method of claim 19, further comprising:

calculating a soft output at each bit position of the soft input based on the difference of the distance of the closest candidate with a "1" value at that position and the distance of the closest candidate with a "0" at that position, when at least some values on the bit position at all candidate codewords have different values; and otherwise selecting the value of the soft output as a predetermined constant when all values on the bit position at all candidate codewords have the same value.

* * * * *